(12) United States Patent
Sasagawa et al.

(10) Patent No.: US 7,911,789 B2
(45) Date of Patent: *Mar. 22, 2011

(54) DISK ARRAY SYSTEM

(75) Inventors: Tsuyoshi Sasagawa, Odawara (JP); Hirokazu Takahashi, Chigasaki (JP); Takahiko Iwasaki, Nakai (JP); Taro Takahashi, Manazuru (JP); Chikazu Yokoi, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/541,059

(22) Filed: Aug. 13, 2009

(65) Prior Publication Data

US 2010/0002374 A1    Jan. 7, 2010

Related U.S. Application Data

(63) Continuation of application No. 12/022,439, filed on Jan. 30, 2008, now Pat. No. 7,593,225.

(30) Foreign Application Priority Data

Mar. 29, 2007 (JP) ................................ 2007-088552

(51) Int. Cl.
*H05K 7/20* (2006.01)
(52) U.S. Cl. ........ 361/695; 361/690; 361/694; 361/725; 174/16.1; 165/80.2; 165/104.33; 165/122
(58) Field of Classification Search .......................... None
See application file for complete search history.

(56) References Cited

U.S. PATENT DOCUMENTS

| | | | |
|---|---|---|---|
| 6,778,386 B2 | 8/2004 | Garnett et al. | |
| 7,046,513 B2 | 5/2006 | Nishiyama et al. | |
| 7,139,170 B2 | 11/2006 | Chikusa et al. | |
| 7,352,571 B2 | 4/2008 | Suzuki et al. | |
| 7,369,406 B2 | 5/2008 | Matsushima et al. | |
| 7,436,663 B2 | 10/2008 | Matsushima et al. | |
| 7,441,130 B2 | 10/2008 | Isobe et al. | |
| 7,444,554 B2 | 10/2008 | Hori et al. | |
| 2001/0046118 A1 | 11/2001 | Yamanashi et al. | |
| 2006/0250768 A1 | 11/2006 | Suzuki et al. | |

FOREIGN PATENT DOCUMENTS

| | | |
|---|---|---|
| JP | 726999 U | 5/1995 |
| JP | 2000149542 A | 5/2000 |
| JP | 2002237178 A | 8/2002 |
| JP | 2004-022057 A | 1/2004 |
| JP | 2007012000 A | 1/2007 |

OTHER PUBLICATIONS

Japanese Office Action corresponding to Japanese Patent Application No. 2007-088552, dated Jan. 26, 2011.

*Primary Examiner* — Boris L Chervinsky
(74) *Attorney, Agent, or Firm* — Sughrue Mion, PLLC

(57) ABSTRACT

In the disk array system, in the basic chassis, HDD modules are installed from a front surface in a front part of a backboard, and duplex CTL modules are installed up and down from a rear surface in a rear part, and duplex power source modules containing fans are installed in the left and right sides thereof. By the operation of the fans, in the rear part, the cooling air flows separately into each CTL module and into each power source module, and the cooling air having passed through the area of the duct by a block in the CTL module is drawn by the fans in the power source module through a ventilation hole and is then exhausted outside. The cooling air flow path to the plurality of ICs is divided by the block. The rotation speed of the fans is controlled by using a temperature sensor.

10 Claims, 17 Drawing Sheets

DISK ARRAY SYSTEM

CROSS-REFERENCE TO RELATED APPLICATION

This is a continuation of application Ser. No. 12/022,439 filed Jan. 30, 2008 now U.S. Pat. No. 7,593,225. The entire disclosure(s) of the prior application(s), application Ser. No. 12/022,439 is considered part of the disclosure of the accompanying continuation application and is hereby incorporated by reference.

The present application claims priority from Japanese Patent Application No. JP 2007-88552 filed on Mar. 29, 2007, the content of which is hereby incorporated by reference into this application.

TECHNICAL FIELD OF THE INVENTION

The present invention relates to a disk array system (also referred to as a storage system) having a function to control a storage device such as a HDD (Hard Disk Drive). More particularly, it relates to configurations of a system chassis and various modules installed therein and ventilation and cooling structures of the system chassis and the modules.

BACKGROUND OF THE INVENTION

In a recent disk array system, mounting density has been increased and performance thereof has been improved. Accordingly, higher cooling performance has also been demanded in order to cope with the temperature rise due to the increase in heat generation of component parts and resulting performance deterioration.

For example, in the disk array system of a predetermined method, elements such as boards (circuit boards) corresponding to various functions and power sources are installed in the system chassis by means of the structure and method of a module (also referred to as a unit, package, and assembly) to take the maintainability into consideration. Further, by mounting fans, heat sinks and others in the system chassis and modules, considerations are given to the ventilation and cooling function. For example, the high-density mounting and high cooling performance are realized by the configuration in which each module is inserted through the opening in front or at the back of the chassis and connected to the front or rear surface of a backboard inside the chassis and by the configuration in which a cooling air flows to the rear surface (back side) from the front surface of the chassis via the backboard by the fan operation.

For example, Japanese Patent Application Laid-Open Publication No. 2004-022057 (Patent Document 1) discloses an example of the configuration of the conventional disk array system.

SUMMARY OF THE INVENTION

With respect to the configurations of the chassis and the module in the conventional disk array system, it is necessary to realize a configuration more effective than the conventional one in consideration of high density mounting and cooling performance. In particular, a disk array system that can satisfy needs of an end user such as the size reduction and higher cooling performance has been demanded.

The present invention has been made in view of the above described problems, and an object of the present invention is to provide a technology that can realize an effective structure with respect to the configurations of the chassis, module, and the like and the ventilation and cooling structures in the disk array system in which high density mounting and cooling performance are taken into consideration.

The typical ones of the inventions disclosed in this application will be briefly described as follows. In order to achieve the above described object, the present invention provides a disk array system comprising a group of storage devices (disk array) such as a HDD and a control device thereof (controller or disk controller), wherein elements such as controllers and power sources are installed in the system chassis by means of the structure and method of a module, and in a redundant configuration in which each function is at least duplicated, each module is inserted through the opening in front or at the back of the chassis and connected to the front or rear surface of a backboard inside the chassis, and cooling is performed by the air ventilated to the rear surface (back side) from the front surface of the chassis via the backboard by the fan operation, and wherein technological means and configurations as shown below are provided.

In the disk array system of the present invention, in consideration of the high density mounting and cooling performance, new configurations for the chassis, modules and others and new cooling structure are provided. The feature of this system lies in that the types of modules and the layout thereof in the chassis are reviewed and the types of modules to be used are reduced, thereby reducing the size of the system. In the configuration of a basic chassis, a storage device module (for example, the SAS HDD) and others are installed from the front surface in the front part partitioned by the backboard, and duplex (two) controller modules are installed up and down from the rear surface in the rear part, and in the left and right areas thereof, duplex (two) power source modules containing a fan unit (a plurality of fans) are installed. In the rear part, the two types of modules (four modules in total) are mainly installed. Further, in the configuration of an expanded chassis, an enclosure module is installed in place of the controller module. The fan unit in the power source models comprises, for example, duplex fans installed front and back, and up and down.

A HDD connector is disposed near the longitudinal center of the backboard so as to correspond to the position of a connector of the SAS HDD, and a connector of the controller is disposed near the upper and lower edges of the backboard so as not to interfere with that connector. Further, two power source modules are disposed in the left and right areas of the two controller modules so as to correspond to positions of the left and right edges of the backboard.

Also, a cooling air flow path in the configuration of the chassis and modules is devised. By the operation of the fan in the power source model, cooling air is taken from the front surface of the chassis to cool the storage device module and others, and then, it flows into the rear part through the opening holes of the backboard. For example, in the front part, the group of storage device modules disposed on the upper side is cooled by the cooling air much more than battery modules and others disposed on the lower side. Also, when the cooling air flows into the rear part, the cooling is split, and one (first cooling air) flows into each controller module and the other (second cooling air) flows into each power source module through the opening holes of the backboard. An almost equal amount of the cooling air is supplied to the duplex modules. In the rear part, inside of each power source module (power source unit) and controller module (components on a substrate such as IC and others) are cooled by the cooling air.

In the power source module, the cooling air (second cooling air) passes through the power source unit on the side close to the connector and is drawn by the fan unit disposed close to the front surface side of the power source module (rear surface side of chassis) at the back of the power source. In the controller module, the cooling air (first cooling air) passes through the area of a duct structure formed by the disposed blocks and cools objects to be cooled such as IC and others on the substrate. The cooling air is not exhausted from the front surface side (rear surface side of chassis) of the controller module to the outside, but it is drawn by the fan units (fan) in the left and right power source modules through a ventilation hole area at a position close to the rear surface of the chassis in a first partition plate (and side surfaces of corresponding modules) between the controller module and the power source module. Then, the cooling air from the controller side together with the cooling air (second cooling air) from the power source side are exhausted outside through the exhaust port of the fan and exhaust hole on rear surface side of the chassis. In this manner, the cooling structure of the area combined with the power source module and the controller module is made more efficient.

Further, this system gives special consideration to the efficient cooling of components (cooling object components) disposed on the cooling air flow path on the substrate in the controller module, in particular, components such as a plurality of ICs adjacently disposed in a row in a back-and-forth direction of the chassis and heat sinks disposed thereon. As the means for this purpose, an effective cooling air flow path (duct structure) that passes through the area of the cooling object components on the substrate is formed by a block structure for the cooling object components. For example, the block is designed to have a roughly trapezoidal shape in section in the back-and-forth direction of the chassis so as to have a slope (inclination) by a side of the trapezoid in the vicinity of the inflow of the cooling air toward the area of the cooling object components. By this means, the flowing cooling air can be smoothly applied to the cooling object components.

Further, in particular, by means of the change in layout and shape of the block, for example, by providing holes and concavity and convexity, the cooling air flow path to the area of the cooling object components is branched so as to correspond to a plurality of cooling object components on the substrate. By this branching, the cooling air can be directly applied to not only the components at a former stage close to the backboard and connector side but also the components at a latter stage of the plurality of cooling object components, and the cooling performance can be improved.

Further, in the controller, enclosure, and others, based on the temperature detected by a temperature sensor provided in the chassis, the rotation speed of the fans in the power source modules are controlled. For example, when the detected temperature reaches the predetermined value or more, the rotation speed of the fans are increased.

The effects obtained by typical aspects of the present invention will be briefly described below. According to the present invention, it is possible to realize an effective structure with respect to the configurations of the chassis, module, and the like and the ventilation and cooling structures in the disk array system in which high density mounting and cooling performance are taken into consideration.

DESCRIPTION OF THE PREFERRED EMBODIMENTS

Figure 1:
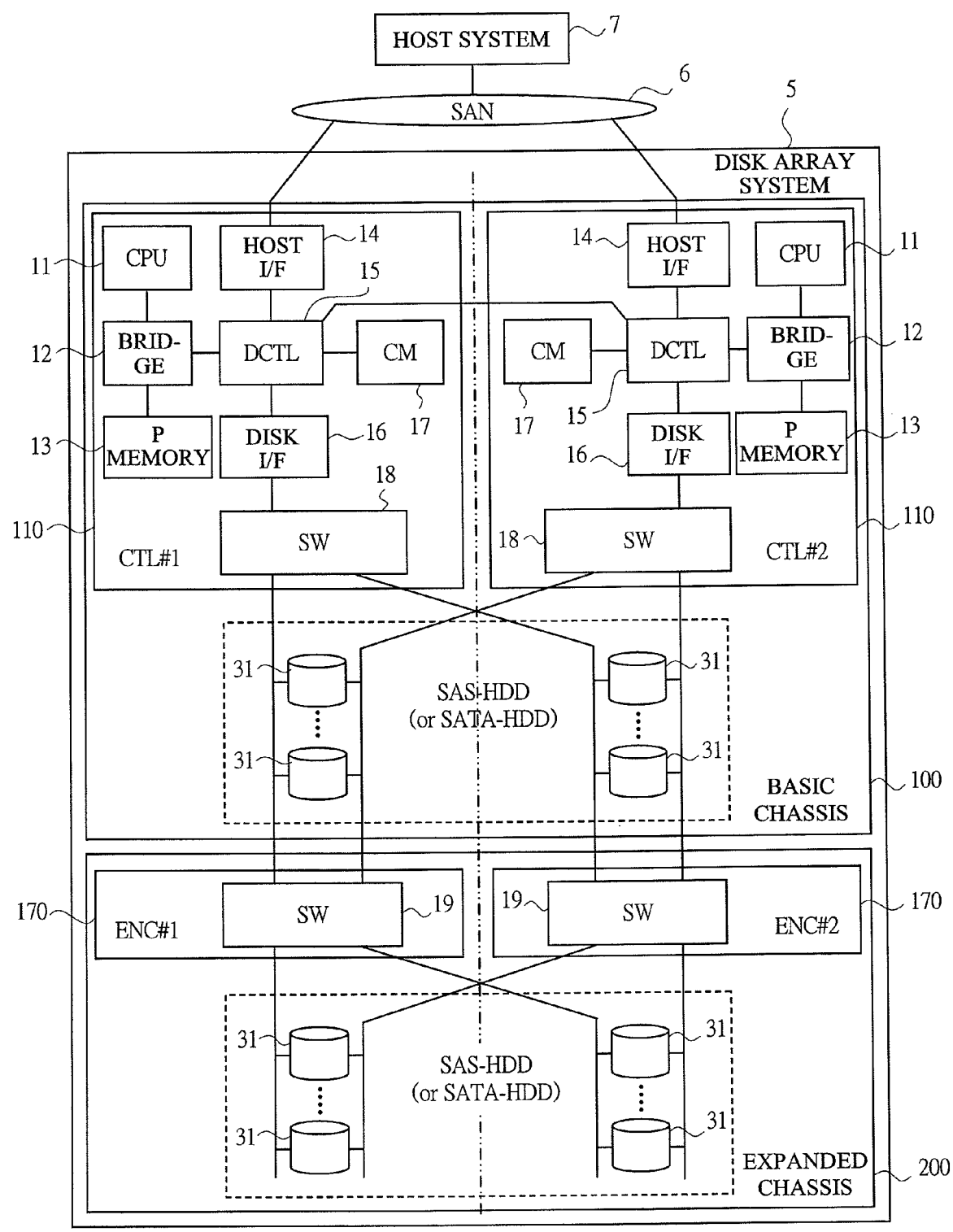
FIG. 1 is a diagram showing a configuration of an information processing system by a disk array system according to an embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<Characteristics of Embodiment>

A disk array system according to an embodiment of the present invention will be described with reference to FIG. 1 to FIG. 20. The main characteristics of the present embodiment are as follows (see FIG. 10 and others). In a disk array system 5, for example, in a basic chassis 100, HDD modules 30 and others are installed in a front part 1 partitioned by a backboard 20 from a front surface (A), and duplex CTL modules 10 are installed up and down in a rear part 2 from a rear surface (B), and further, duplex power source modules 40 containing a plurality of fans 43 are installed in the left and right areas thereof. By the operation of the fans 43, the cooling air flows from the front surface (A) to cool the HDD modules 30 and others, and it flows into the rear part 2 through opening holes 220 of the backboard 20. Then, in the rear part 2, one cooling air flows into each CTL module 10, and the other cooling air flows into each power source module 40. In the CTL module 10, the cooling air passes through an area 114 with a duct structure by a block 150 and cools cooling object components such as ICs. The cooling air is not exhausted from the CTL module 10, but is drawn by the fans 43 in the power source module 40 through a ventilation hole 96 and the like of a partition plate 95, and then exhausted to the outside together with the cooling air in the power source module 40. By branching the cooling air flow path to a plurality of components such as ICs on a CTL substrate 120 by changing the structure of the block 150, the cooling air is directly applied also to the components of the latter stage. Further, the rotation speed of the fans 43 is controlled by the CTL 110 and others based on the temperature detected by a temperature sensor 115.

<System (1)>

FIG. 1 shows the functional block configuration of an information processing system in this disk array system 5. A host system 7 is a high order information processing system such as a PC, a server, and a main frame used by a user. The host system 7 and the disk array system 5 are connected by communication means such as a SAN (Storage Area Network) 6 or a LAN (Local Area Network).

The disk array system 5 mainly comprises a basic chassis 100 and an expanded chassis 200. The basic chassis 100 is provided with both a control function (CTL 110 and the like) and a storage function (HDD 31 group). The expanded chassis 200 is optional and is mainly provided with the storage function (HDD 31 group).

A controller (CTL#1 and #2) 110 comprises a CPU 11, a bridge 12, a program memory (P memory) 13, a host I/F (also referred to as a host interface control unit, a channel I/F control unit, and the like) 14, a data controller (DCTL) 15, a disk I/F (disk interface control unit) 16, a cash memory (CM) 17, a switch (SW) 18, and others.

The CPU 11 executes a program stored in the program memory 13 through the bridge 12, thereby performing a processing to control the entire system. The DCTL 15 mutually connects each of the units and controls data transmission. The cache memory CM 17 is a shared memory to cash (store) the data in the CTL 110. The host I/F 14 is a processing unit to which the host system 7 and the like are connected. The disk I/F 16 is a processing unit to which the HDD 31 group is connected via the SW 18.

The SW 18 has a SAS expander (EXP) function and an environment management function. The EXP function is a function such as an access control for the group of HDDs 31 corresponding to the SAS interface. The environment management function includes a function (conventional environment management function) to monitor and detect a trouble, a failure and a state such as connection regarding resources such as a power source (PS), fans, and the HDD 31 and a temperature management function (cooling management function) including a fan control which is one of the characteristics of the present invention to be described later.

The HDD 31 is a HDD with the SAS interface (or SATA interface). On the physical memory area provided by the HDD 31 group, a logical volume which is a logical memory area is set. Further, a RAID group by the plurality of HDDs 31 is set, and a RAID control can be executed. The SAS HDDs 31 are connected by "two-path two-port" to the SW 18 and a SW 19.

The enclosure (ENC#1 and #2) 170 comprises the SW 19 and performs a connection with the CTL 110 and a relay to the ENC 170 when another ENC 170 is connected. The SW 19 has a function similar to that of the SW 18 in the CTL 110 of the basic chassis 100, and it takes charge of the control inside the expanded chassis 200. The SW 18 of the basic chassis 100 and the SW 19 of the expanded chassis 200 are connected, and the disk I/F 16 can access the target HDDs 31 in the basic chassis 100 and the expanded chassis 200.

As shown by a chain line in the center, the CTL 110, ENC 170, HDD 31 group, and others are duplicated, and an access can be made from one side (#1 and #2) to the other side (#2 and #1).

The data processing in the disk array system 5 is as follows. In response to a data write request (command) from the host system 7, the CTL 110 temporarily stores the data received from the host I/F 14 in the CM 17 and writes the data in the predetermined logical volume on the HDD 31 group by the disk I/F 16. Further, in response to the data read request (command) from the host system 7, the CTL 110 reads the data from the predetermined logical volume on the HDD 31 group by the disk I/F 16 and stores the data temporarily in the CM 17, and then transmits it to the host system 7 through the host I/F 14. Since a plurality of host I/Fs 14 and a plurality of disk I/Fs 16 are provided in this configuration, a plurality of data inputs and outputs can be processed in parallel.

<System (2)>

Figure 2:
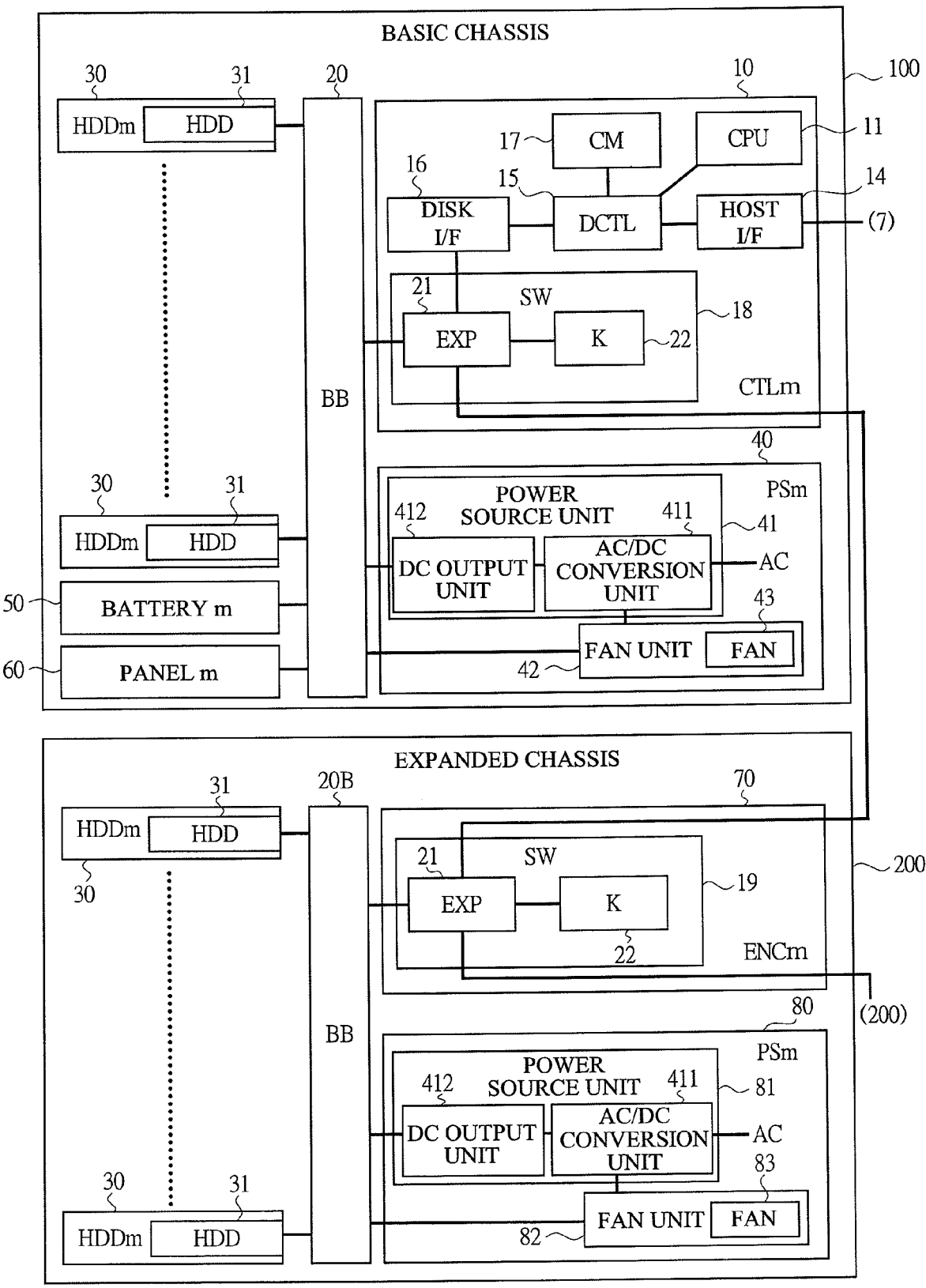
FIG. 2 shows a system configuration by the connection of modules to backboards in a basic chassis and an expanded chassis in the disk array system of the present embodiment.

FIG. 2 shows a system configuration (duplicated parts are omitted) for connecting the modules (shown by m) to the backboards (BB) 20 and 20B in the basic chassis 100 and the expanded chassis 200 of the disk array system 5. Through the wirings of the backboard 20 and 20B, each of the components is mutually connected. In the basic chassis 100, the HDDs 31 of the plurality of HDD modules 30, duplex battery modules 50, and a panel module 60 are connected to the front surface of the backboard 20 through the connectors. Further, the duplex CTL modules 10 and the duplex power source (PS) modules 40 are connected to the rear surface of the backboard 20. In the expanded chassis 200, the HDDs 31 of the plurality of HDD modules 30 are connected to the front surface of the backboard 20B through the connectors. Further, the duplex ENC modules 70 and duplex power source modules 80 are connected to the rear surface of the backboard 20B.

The SW 18 of the CTL 110 (the bridge 12 and others are omitted here) and the SW 19 of the ENC 170 have the SAS expander (EXP) 21 corresponding to the EXP function and the environment management unit (K) 22 corresponding to the environment management function. Between the chassis, the connection between the EXPs 21 is made by a communication cable and the like. Incidentally, the configuration in which the environment management unit (K) 22 is located at positions other than the SW18 and SW19 is also possible.

The EXP 21, based on a control from the high order disk I/F 16, controls data input and output accesses and the path switching and others to the HDD 31 group of each chassis by the SAS interface.

The environment management unit (K) 22, based on a control from the high order (CPU 11 and others), monitors and detects a state of the power source unit (41 and the like), fan unit (42 and the like), the HDD 31 and the like installed in the chassis and performs the control of the power source system and the control of the fan operation mode (fan control and cooling system control) using the fan unit (42 and the like) through the backboard 20 and others.

The power source module 40 comprises a power source unit 41 and a fan unit 42. The power source unit 41, based on an AC input, converts AC into DC by an AC/DC conversion unit 411 and outputs DC power to the backboard 20 from a DC output unit 412. The DC power is supplied to each component through the circuit of the backboard 20. The AC/DC conversion unit 411 corresponds to an SWPS 913. The fan unit 42 comprises a plurality of fans 43. The DC power (driving voltage) is inputted to the fan unit 42 from the power source 41 and others and the fans 43 are rotated. The rotation speed of the fan 43 is controlled by the driving voltage.

The power source module 80 on the expanded chassis 200 side has basically the same configuration (layout, cooling structure and the like are different) as the power source module 40 on the basic chassis 100 side, and it comprises a power source unit 81, a fan unit 82 (a plurality of fans 83) and others.

<Power Source System>

Figure 3:
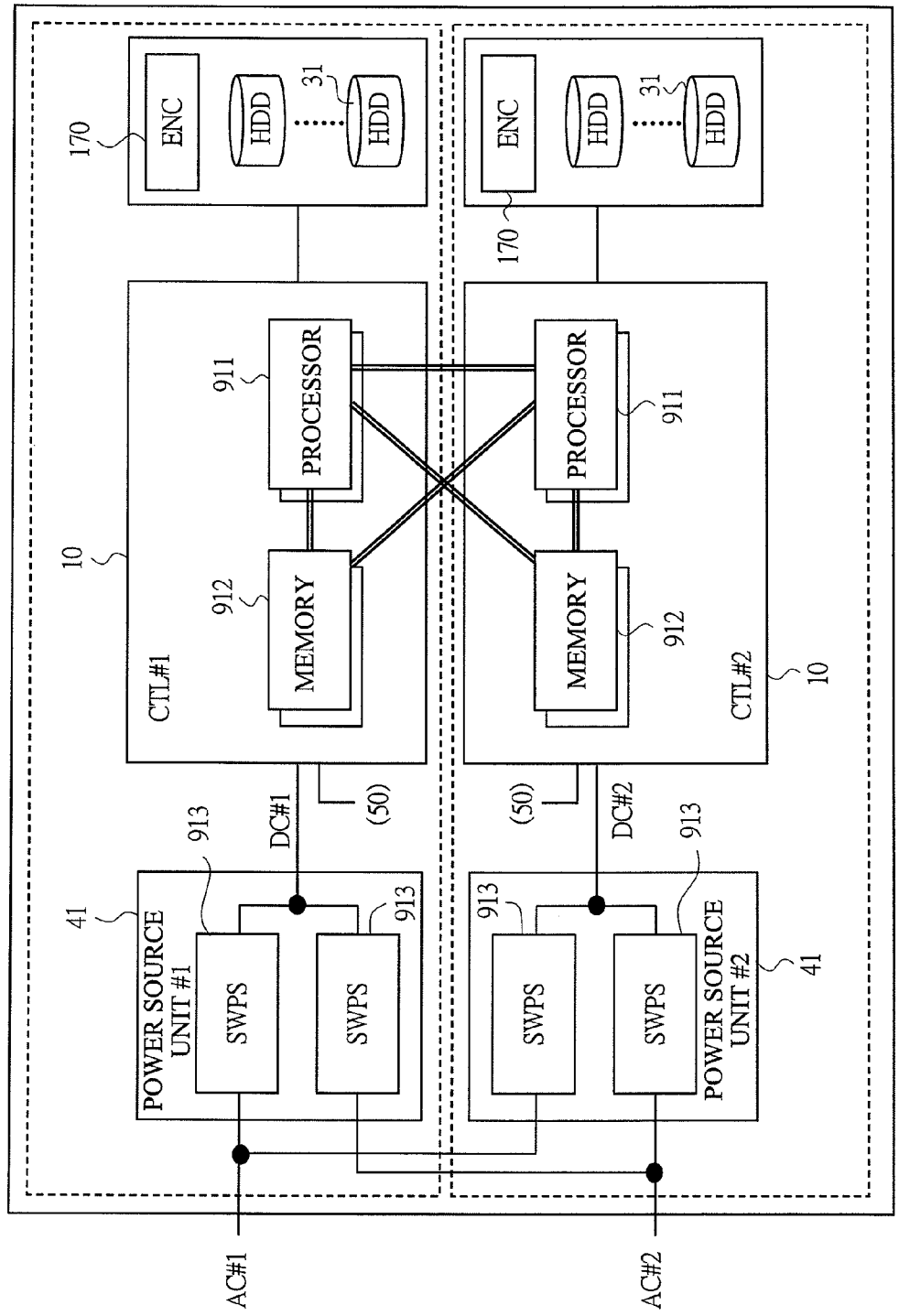
FIG. 3 is a diagram schematically showing a configuration of a power source system in the disk array system of the present embodiment.

The configuration of the power source system of the disk array system 5 will be described with reference to FIG. 3. This is the configuration of the power source of two systems corresponding to the duplex structures such as the CTL 110, ENC 170, and HDD 31 group. The power source unit 41 (#1 and #2) in each power source module 40 (or 80) has a redundant configuration comprising two switching power sources (SWPS) 913 (corresponding to 411). This power source unit 41 generates DC outputs (DC#1 and #2) based on two AC inputs (AC#1 and #2), respectively, and outputs them to each component of the corresponding CTL 110 and the like.

In each CTL 110, each processor 911 (CPU 11 and the like) can refer not only to the memory 912 (CM 17 and the like) on its own side (for example, #1) but also to the processor 911 and the memory 912 in the CTL 110 of the other side (for example, #2). The read/write of the data, the control information and others can be mutually performed between the duplex CTLs 110 so that no problem occurs even when one of them is in trouble.

The DC output is supplied also to components such as the ENC 170, HDDs 31, and the like from the corresponding power source unit in the same manner. When the DC supply is cut off, the DC output is supplied from the battery module 50.

The battery module 50 corresponds to UPS (uninterruptible power source unit), and it contains a plurality of batteries and supplies an emergency power source. When the power supply is stopped due to the power outage and the like, the battery module 50 supplies necessary power to prevent the data loss and the like at the power outage. More specifically, the battery module 50 supplies at least the power required until the data of the memory 912 (CM17 and the like) is written in the HDD 31 by the processor 911 of the CTL 110 and a premeditated stop is automatically executed and completed. As a result, the data loss at the time of the power outage can be prevented.

<Chassis>

Next, the external configuration of the entire hardware of the chassis of the disk array system 5 will be described with reference to FIG. 4 to FIG. 9 and others. The basic chassis 100 and the expanded chassis 200 have a predetermined size which is mountable on a rack (frame) with a size in conformity to the predetermined standard. The size of the basic chassis 100 is Width: X1, Depth: Y1, and Height: Z1. The size of the expanded chassis 200 is Width: X1, Depth: Y1, and Height: Z2. Specifically, as the size of the height of the chassis, 3 U (approximately 133.35 mm), 4 U, and others in EIA STANDARD EIA-310-D are suitable. A ratio of the height (Z1) of the basic chassis 100 and the height (Z2) of the expanded chassis 200 is preferably 4 U:3 U. For example, the rack (not shown) has a box shape with openings in its front and rear surfaces, and each chassis (100 and 200) can be mounted up and down therein.

The modules to be installed in each of the chassis include various types modules in the present embodiment, for example, the CTL module 10, the HDD module 30, the power source module 40, the battery module 50, the panel module 60, the ENC module 70, and the power source module 80. In the installation of the HDD module 30 to the chassis, the hot plug is enabled. Operations such as insertion/removal and fixation of each module to and from the chassis (100 and 200) by a person are performed by using an operating lever and the like provided in the module. The operation of the HDD module 30 is performed by using the operating handle and the like.

The operation in the case of the modules (CTL module 10, power source module 40, battery module 50, ENC module 70, and power source module 80 in the present embodiment) provided with the operating lever is as follows. First, when mounting the module in the chassis, a customer engineer or end user inserts the module into a predetermined area in the chassis, connects the connector thereof to the backboard 20, and then moves down the operating lever to fix the module (fixed state) by a latch action. When taking out the module from the chassis, the customer engineer or end user moves up the operating lever to release the fixed state by a latch release action and removes the module from the predetermined area in the chassis.

Each chassis is made of metal in general and has a box shape, and can be disassembled by screws and others. A partition plate and the like which correspond to the area to which each module is installed are provided in the chassis. Further, an outer wall (main body) and the partition plate of the chassis are provided with the structure corresponding to the operation of insertion/removal and fixation of the modules, for example, a guide rail (structure of grooves, protrusions, and the like) and a receiving portion of the operating lever (structure for receiving a latch portion and a hook portion of the operating lever). Further, the partition plate (and its ventilation holes and the like) has a function to adjust the flow of the cooling air in addition to the function of fixation, reinforcement, and the like. Incidentally, the duplex two modules have the same configuration and are configured to be attachable to both of the two mounting areas in the chassis.

<Basic Chassis>

Figure 4:
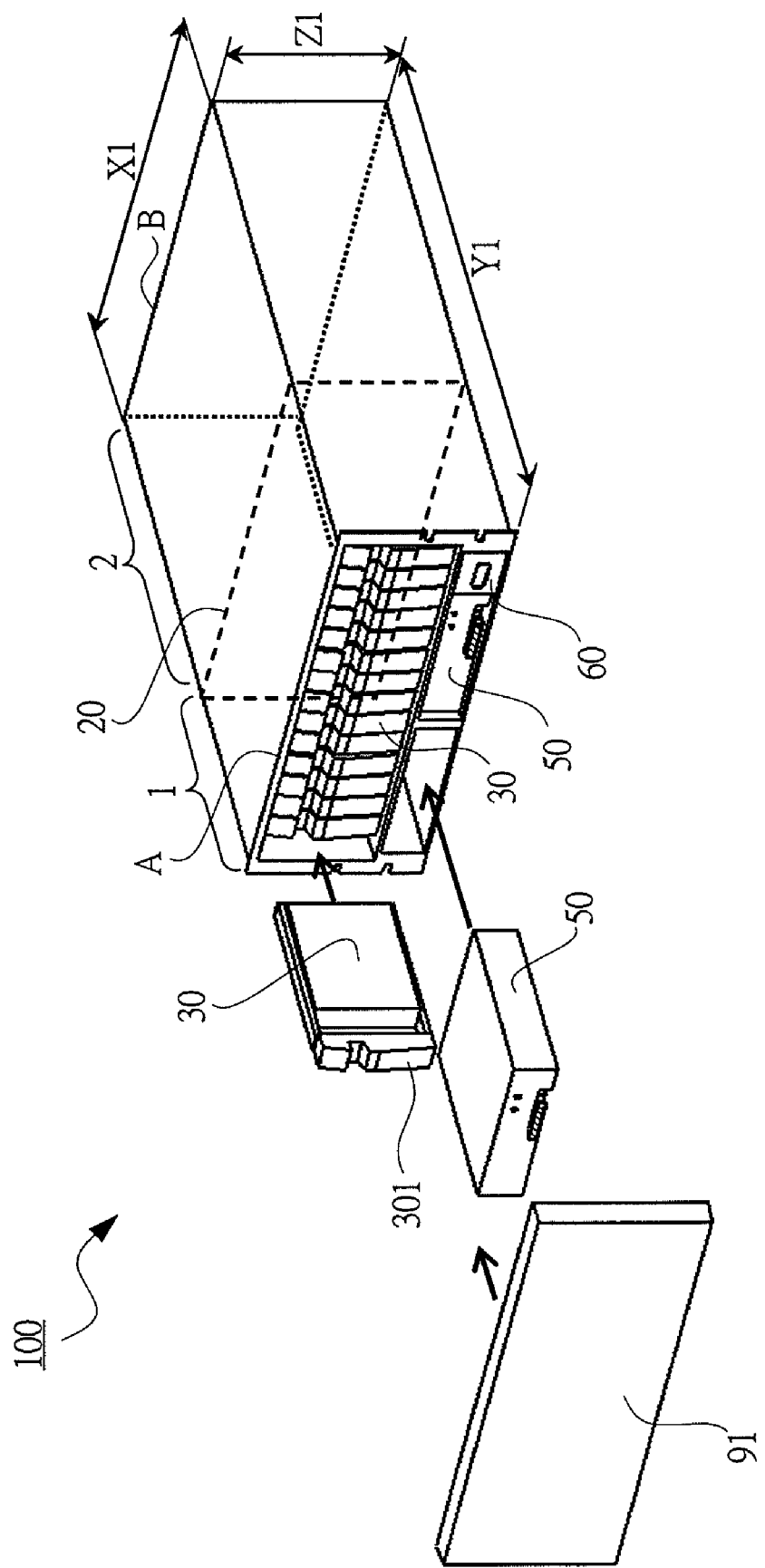
FIG. 4 is a perspective view showing a hardware configuration of the basic chassis seen from a side of a front surface (A)

A hardware configuration of the basic chassis 100 will be described with reference to FIG. 4 and FIG. 5. FIG. 4 is a diagram showing the configuration seen from the side of the opening of the front surface (A) of the basic chassis 100, and FIG. 5 is a diagram seen from the side of the opening of the rear surface (B) of the basic chassis 100.

In FIG. 4, the basic chassis 100 has openings in the front surface (A) and the rear surface (B) thereof, and the chassis is divided into a front part 1 (front surface side space) and a rear part 2 (rear surface side space) by the backboard 20 attached to the position at the midpoint in the chassis as a boundary.

In the front surface (A) of the front part 1 of the basic chassis 100, a plurality of HDD modules 30 can be attached to the upper side thereof. Further, two battery modules 50 and the panel module 60 can be attached to the lower side thereof. A bezel (door) 91 having an air permeability can be attached to the front surface (A) in a state where each module is installed.

Figure 5:
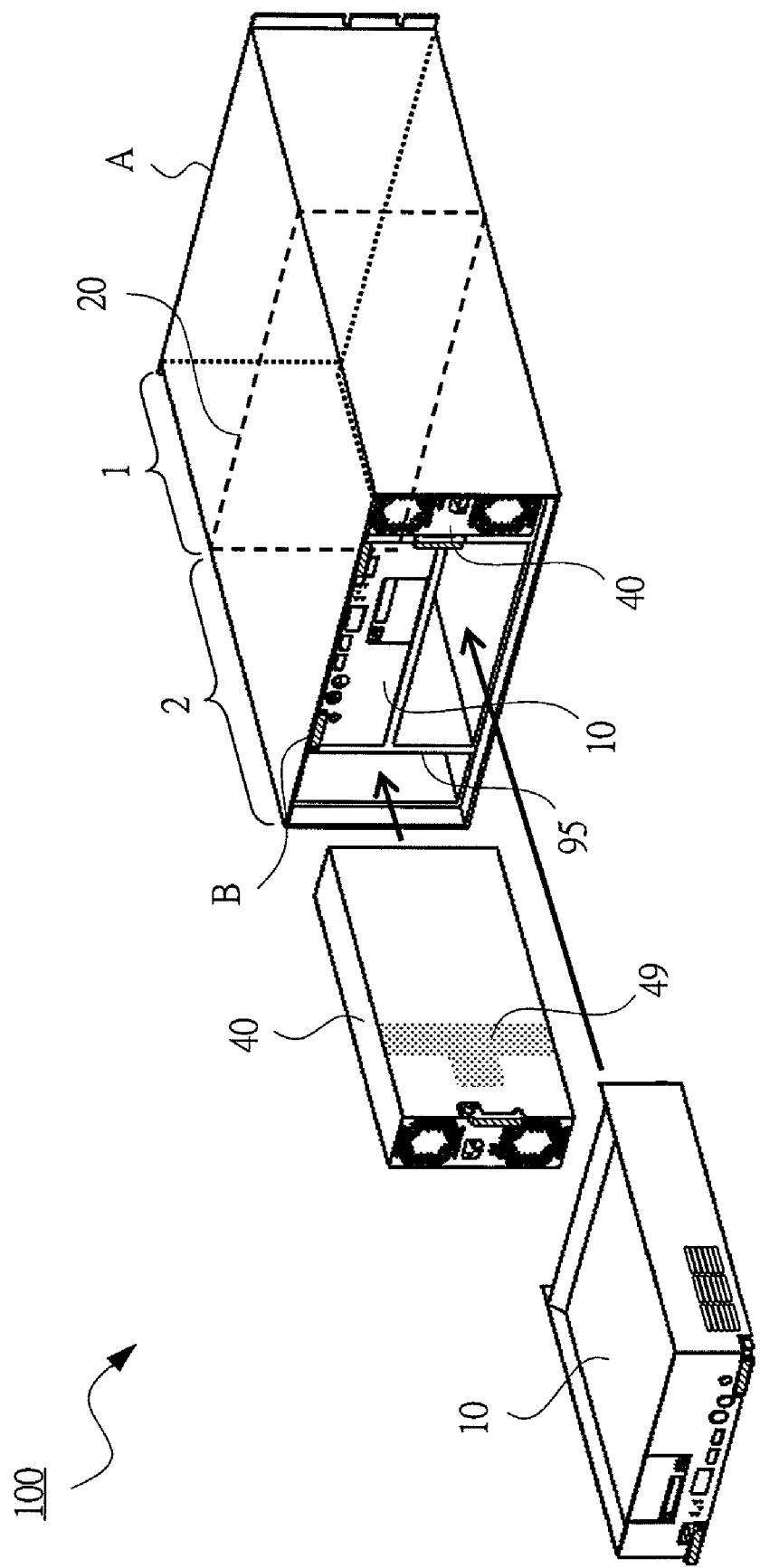
FIG. 5 is a perspective view showing a hardware configuration of the basic chassis seen from a side of a rear surface (B)

In FIG. 5, the rear surface (B) of the rear part 2 of the basic chassis 100 has the configuration to which two CTL modules 10 and two power source modules 40 can be mounted. Two power source modules 40 are installed on the left and right sides of the rear surface (B) of the rear part 2, and two CTL modules 10 are installed in the area sandwiched between these modules.

<Expanded Chassis>

Figure 6:
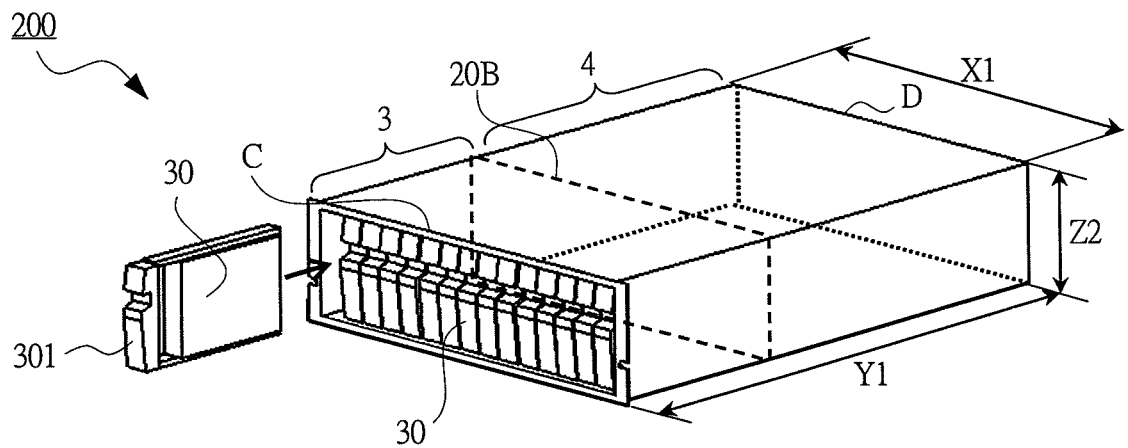
FIG. 6 is a perspective view showing a hardware configuration of the expanded chassis seen from as side of a front surface (C)

A hardware configuration of the expanded chassis 200 will be described with reference to FIG. 6 and FIG. 7. FIG. 6 shows a configuration of the expanded chassis 200 seen from the side of the opening of the front surface (C), and FIG. 7 shows a configuration of the expanded chassis 200 seen from the side of the opening of the rear surface (D).

In FIG. 6, the expanded chassis 200 has the openings in the front surface (C) and the rear surface (D) thereof, and the chassis is divided into a front part 3 (front surface side space) and a rear part 4 (rear surface side space) by the backboard 20B attached to the position at the midpoint in the chassis as a boundary.

In the front surface (C) of the rear part 3 of the expanded chassis 200, the plurality (15 sets) of HDD modules 30 can be attached in a state aligned in a lateral direction. Incidentally, in the case of the expanded chassis 200, other modules do not have to be installed on the front surface (C) side.

Figure 7:
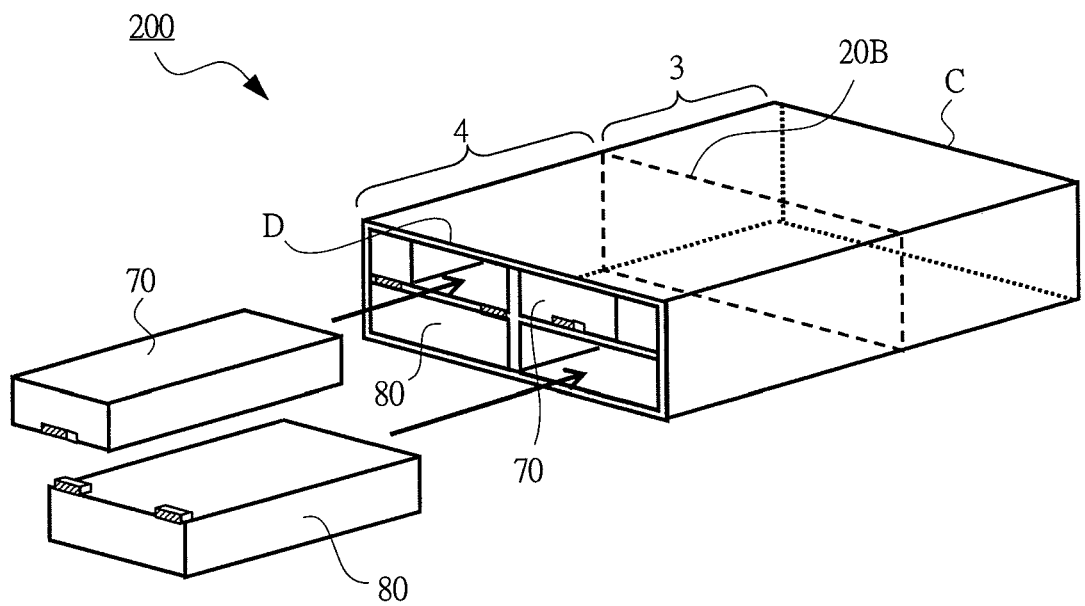
FIG. 7 is a perspective view showing a hardware configuration of the expanded chassis seen from a side of a rear surface (D)

In FIG. 7, the rear surface (D) of the rear part 4 of the expanded chassis 200 has the configuration to which two ENC modules 70 and two power source modules 80 can be mounted. The duplex ENC modules 70 are disposed side by side in an upper central area of the rear surface (D) of the rear part 4, and the duplex power source models 80 are disposed side by side in an area below them.

<Basic Chassis—Front and Rear Surfaces>

Figure 8A:
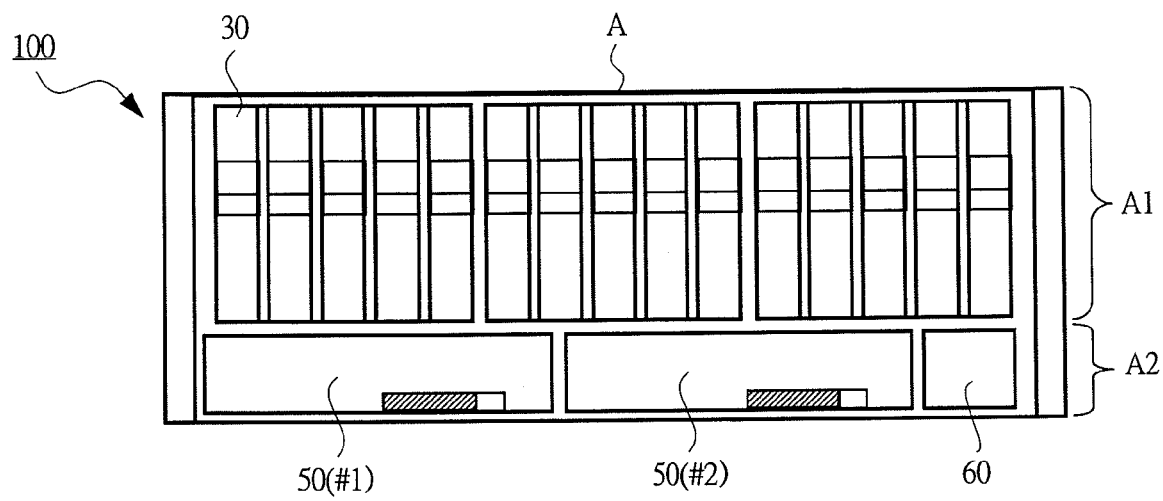
FIG. 8A is a diagram showing a configuration of the front surface (A) of the basic chassis.

Next, FIG. 8A shows a configuration of the front surface (A) of the basic chassis 100. In the front part 1, a plurality (up to 15 sets in the present embodiment) of HDD modules 30 in an upright position are installed in a relatively wider upper area (A1) in a state aligned in a lateral direction. Two battery modules (#1 and #2) 50 in a horizontal position are installed side by side in a relatively narrower lower area (A2), and the panel module 60 is installed adjacent to the battery module, that is, in the lower right corner area of the front surface (A). The panel module 60 is a unit to display basic operations and states such as ON and OFF of the power source in the system. The boundary between the upper area (A1) and the lower area (A2) is provided with a partition plate. The operating lever is provided at one position of the lower side of the battery module 50.

Figure 8B:
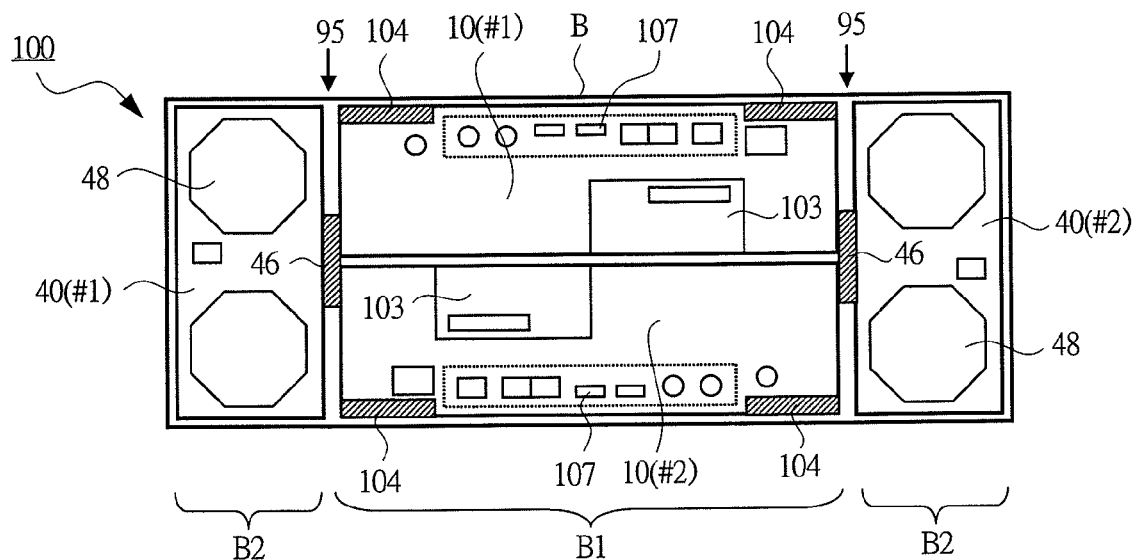
FIG. 8B is a diagram showing a configuration of the rear surface (B) of the basic chassis.

FIG. 8B shows a configuration of the rear surface (B) of the basic chassis 100. In the rear part 2, the power source modules (#1 and #2) 40 in an upright position are installed in the areas (B2) close to the left and right sides of the rear surface (B). Two CTL modules (#1 and #2) 10 in a horizontal position are installed up and down in the intermediate area (B1) sandwiched between the power source modules. The same two CTL modules 10 are installed upside down relative to each other. The same two power source modules 40 laterally reversed to each other are installed.

The partition plate 95 is provided at the boundary between the side surface of the power source module 40 and the side surface of the CTL module 10. A partition plate is provided at the boundary between the upper and lower two CTL modules 10.

A surface of a host I/F unit 103 corresponding to the host I/F 14 and an area 107 of various types of terminals are provided in a part of the front surface (106) of the CTL module 10. Two operating levers 104 are provided at the left and right corners of the front surface of the CTL module 10, and the insertion/removal and the fixation of the CTL module 10 by the two operating levers 104 can be performed.

An exhaust hole 48 and the like corresponding to the positions of the exhaust ports of a power source switch and a fan 43 are provided in the front surface of the power source module 40. One operating lever 46 is provided on one side surface of the power source module 40.

<Expanded Chassis—Front and Rear Surfaces>

Figure 9A:
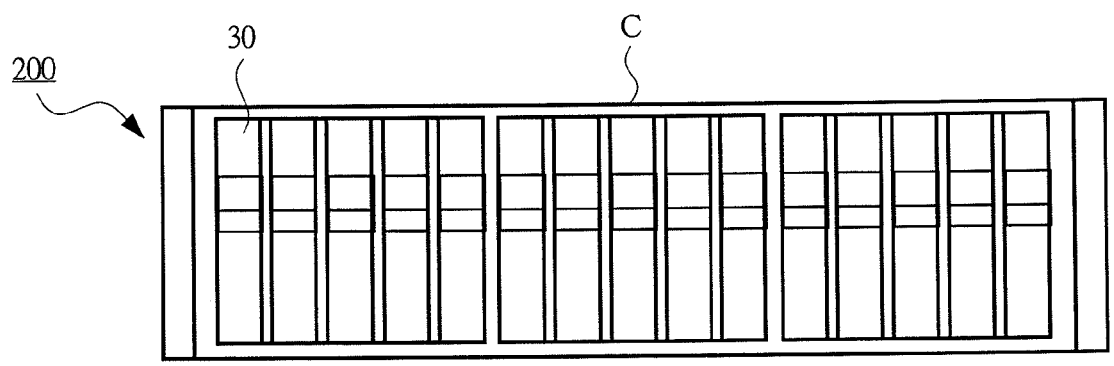
FIG. 9A is a diagram showing a configuration of the front surface (C) of the expanded chassis.

FIG. 9A shows a configuration of the front surface (C) of the expanded chassis 200. A plurality (up to 15 sets) of HDD modules 30 are installed into the entire area of the front part 31 in a state aligned in a lateral direction.

Figure 9B:
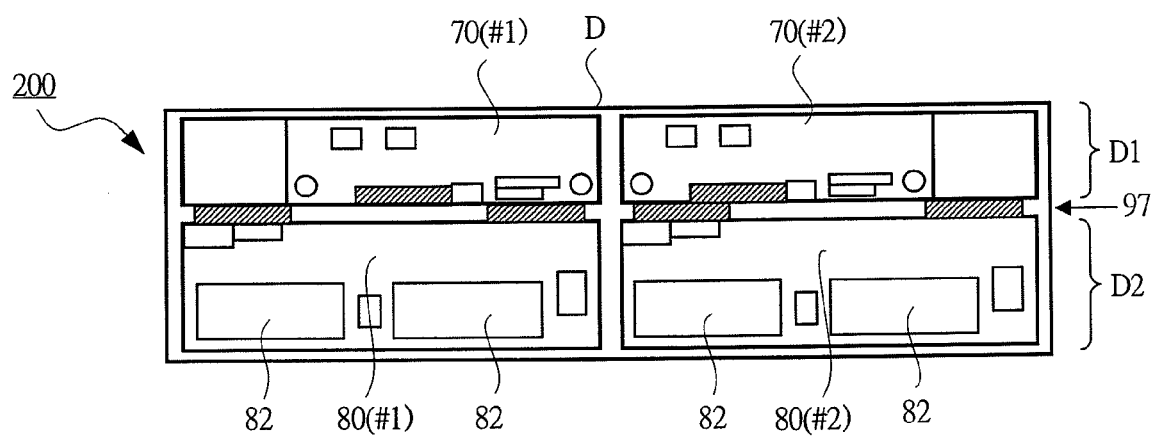
FIG. 9B is a diagram showing a configuration of the rear surface (D) of the expanded chassis.

FIG. 9B shows a configuration of the rear surface (D) of the expanded chassis 200. In the rear part 4, two ENC modules 70 in a horizontal position are installed side by side in an upper central area (D1) of the rear surface (D). Two power source modules 80 in a horizontal position are installed side by side in the lower area (D2). The two ENC modules 70 and the two power source modules 80 are oriented in the same direction.

The partition plate 97 is provided at the boundary between the upper ENC module 70 and the lower power source module 80. A partition plate is provided between the left and right modules. One operating lever is provided at the middle of the front surface of the ENC module 70.

The ventilation hole and the like corresponding to the positions of the exhaust ports of a power source switch and a fan (83) are provided in the front surface of the power source module 80. Two operating levers are provided at the upper left and right sides of the power source module 80.

<Basic Chassis—Horizontal Surface>

Figure 10:
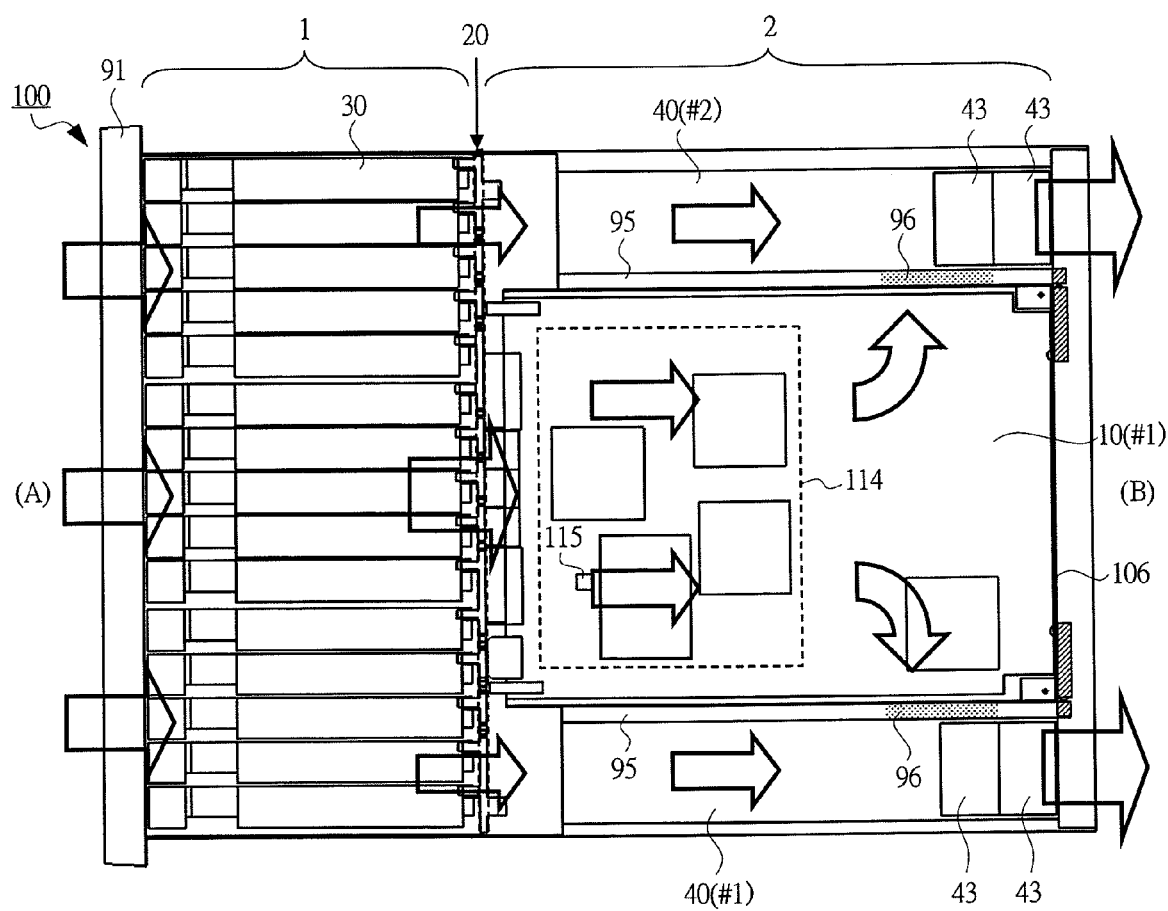
FIG. 10 is a diagram schematically showing a planar structure of the basic chassis in the horizontal direction and a representative flow (at the normal time) of the cooling air.

Next, FIG. 10 shows a schematic horizontal planar configuration (corresponding to the section of one CTL module 10 seen from above) of the basic chassis 100. Further, the arrow marks show representative flow and a flow amount of the cooling air (to be described later). The front part 1 has the HDD modules 30, and the rear part 2 has the CTL module (#1) 10 and the two left and right power source modules 40. Two fans 43 as a fan unit 42 are provided in a row in a back-and-forth direction on the rear side of the power source module 40. Ventilation holes 96 are provided at the illustrated positions in each partition plate 95 between the CTL module 10 and the power source module 40. An area 114 in which a block 150 is disposed above such components as ICs on the substrate is provided in the CTL module 10.

<Basic Chassis—Vertical Surface>

Figure 11:
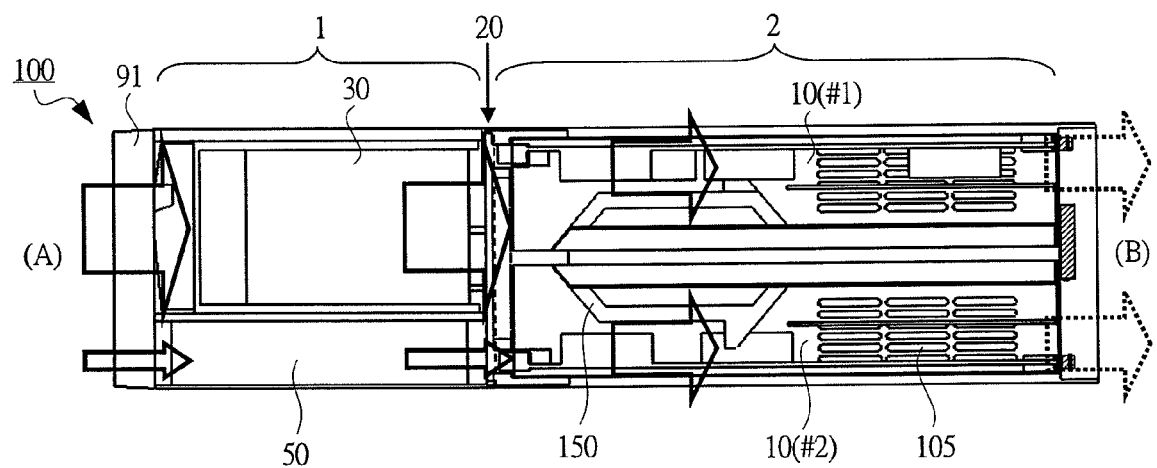
FIG. 11 is a diagram schematically showing a planar structure of the basic chassis in vertical direction (side surface) and a representative flow of the cooling air.

FIG. 11 shows a schematic vertical planar configuration (corresponding to the section of the CTL module 10 seen from the side thereof) of the basic chassis 100. In the front part 1, the HDD module 30 is installed on the upper side, and the battery module 50 is installed on the lower side. In the rear part 2, two CTL modules 10 are installed up and down. The block 150 is provided on the front side in the CTL module 10.

A ventilation hole 105 is provided on the rear side of the side surface of the CTL module 10.

<Basic Chassis—Backboard Surface>

Figure 12:
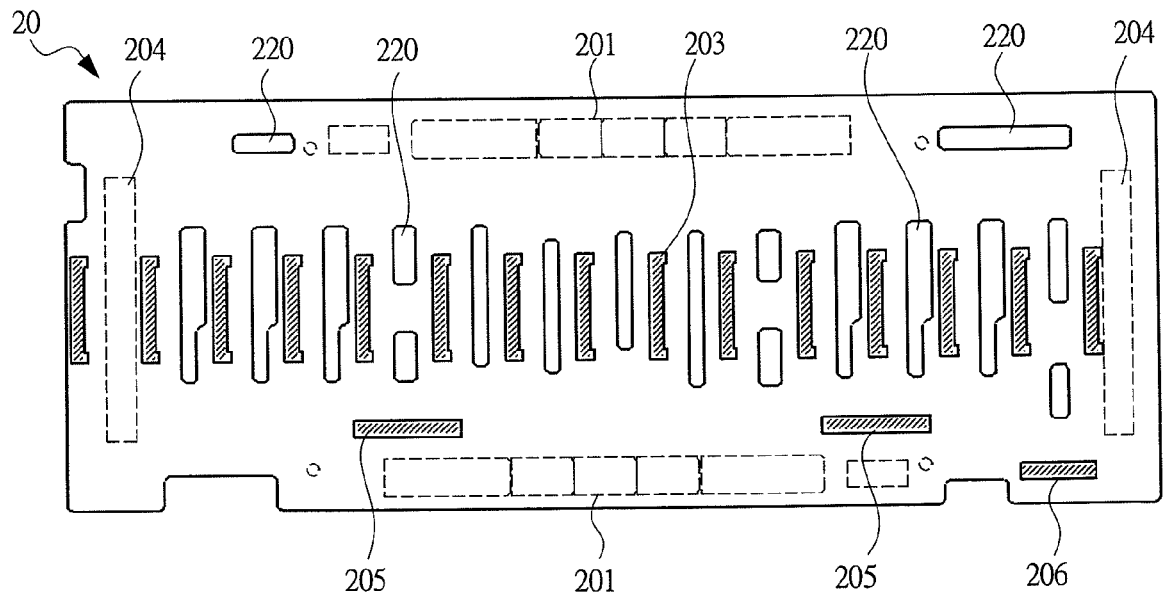
FIG. 12 is a diagram showing the configuration of the basic chassis seen from the front surface side of the backboard.

FIG. 12 shows the surface (front surface) of the backboard 20 in the basic chassis 100. The backboard 20 is a circuit board with a roughly flat planar shape and is fixed to a frame part positioned at the middle and slightly close to the front side of the basic chassis 100. The backboard 20 electrically connects each of the modules by connector connection and physically supports them. The fixation of the module mentioned here corresponds to the state in which the connector of the rear surface of the module and the corresponding connector of the backboard 20 are engaged and electrically connected.

A group of connectors (203, 205, and 206) for connecting the HDD module 30, the battery module 50, the panel module 60, and the like are provided on the front surface of the backboard 20. A group of connectors (201 and 204) for connecting the CTL module 10, the power source module 40, and the like are provided on the rear surface of the backboard 20. Further, wiring patterns for the mutual connection between the connectors and openings (ventilation holes) 220 through which the cooling air is supplied from the front part 1 to the rear part 2 are provided in the backboard 20.

A plurality of connectors (HDD connectors) 203 for the connection of the HDD modules 30 with a longitudinal rectangular shape are disposed on a zone extending in a lateral direction near the center (center zone) of the backboard 20. Further, connectors (battery connectors) 205 for the connection of the battery modules 50 with a horizontal rectangular shape are disposed below the HDD connectors 203. Further, a connector (panel connector) 206 for the connection of the panel module 60 is disposed near the lower right corner of the backboard 20.

Further, connectors (CTL connectors) 201 to be connected to the CTL modules 10 are disposed near the center of the upper and lower sides on the rear surface side of the backboard 20, while interposing the area of the HDD connector 203 therebetween. That is, on the upper side, the CTL connector 201 for the connection of the module (10) of a first CTL (#1) with a lateral rectangular shape is disposed. On the lower side, the CTL connector 201 for the connection of the module (10) of a second CTL (#2) is similarly disposed. Further, connectors (power source connectors) 204 for the connection of each power source module 40 with a longitudinal rectangular shape are disposed near the center of the left and right sides of the backboard 20.

Further, in the center zone of the backboard 20, a plurality of opening holes 220 with a longitudinal rectangular shape are formed between the HDD connectors 203. In addition, opening holes 220 with a lateral rectangular shape are formed on both sides of the upper CTL connector 201. The position, shape, size, and the like of the opening holes 220 are designed based on the flow amount distribution of the cooling air flow path in the chassis (to be described later).

<HDD Module>

Figure 13A:
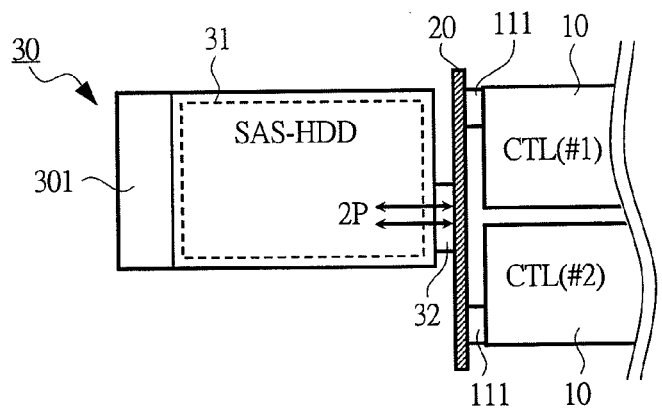
FIG. 13A is a diagram showing a configuration of the connection of a HDD module to the backboard of the basic chassis in the case of a SAS-HDD.
Figure 13B:
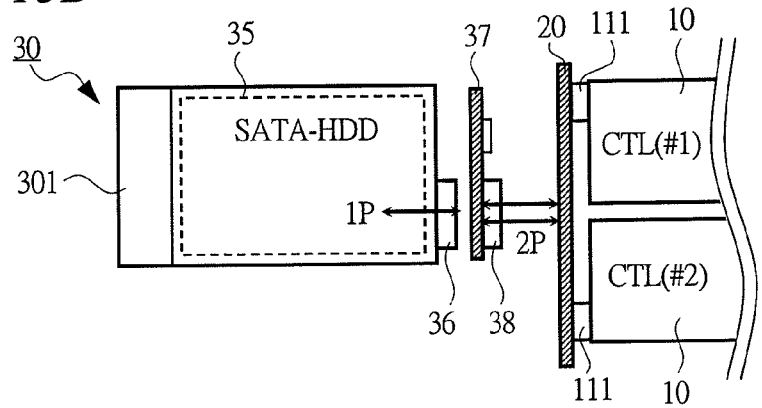
FIG. 13B is a diagram showing a configuration of the connection of a HDD module to the backboard of the basic chassis in the case of a SATA-HDD.

Next, FIG. 13A and FIG. 13B show the HDD module 30 (also referred to as canister module). The HDD 31 is stored in the HDD module 30, and a connector 32 to be connected to the connector 203 on the backboard 20 is provided on the rear surface of the HDD module 30. A handle 301 is provided on the front surface of the HDD module 30, and the operation of insertion/removal and fixation of the HDD module 30 can be performed by this handle. The HDD module 30 has a uniform external appearance by the design of the handle 301 and the like. The HDD 31 of the HDD module 30 installable in the present embodiment is either the Serial Attached SCSI HDD (SAS-HDD) 31 shown in FIG. 13A or the Serial ATA (SATA) interface HDD (SATA-HDD) 35 shown in FIG. 13B.

In FIG. 13A, in consideration of the position of the connector 32 of the SAS-HDD 31 and the installing position of the HDD module 30, the connector position of each of other modules, the module installing position, and shape are designed. Between the duplex CTL 110 (disk I/F 16) and the SAS-HDD 31, the data input/output processing is performed by the "two-port and two-path (2P)" according to the SAS interface. The SAS-HDD 31 side has two ports (2P).

In FIG. 13B, when the HDD module 30 of the SATA-HDD 35 is installed, a path control board (I/F conversion substrate) 37 is interposed and connected between the connector 36 of the SATA-HDD 35 and the connector (203) of the backboard 20 so as to match with the position of the connector 32 of the SAS-HDD 31. More specifically, the connector 32 of the SAS-HDD 31 and the corresponding connector of the path control board 37 are connected, and the connector 38 of the path control board 37 and the corresponding connector (203) of the backboard 20 are connected. The SATA-HDD 35 has one port (1P). In the case of the connection of the SATA-HDD 35, the I/F conversion is performed by the SATA and the SAS by the control board 37 having the two ports.

<Power Source Module>

Figure 14A:
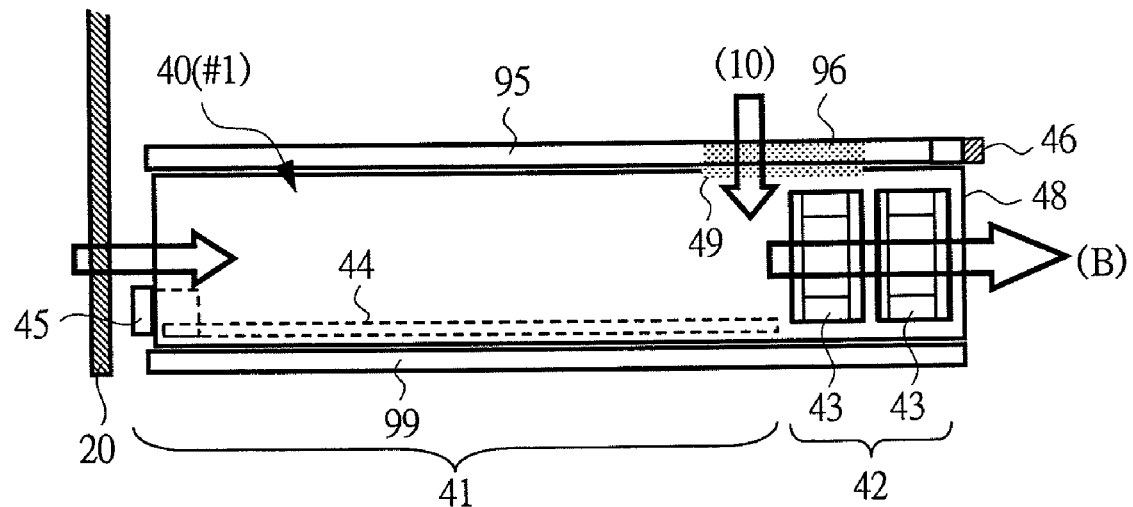
FIG. 14A is a diagram schematically showing a planar configuration of a power source module installed in the basic chassis and its periphery in the horizontal direction.
Figure 14B:
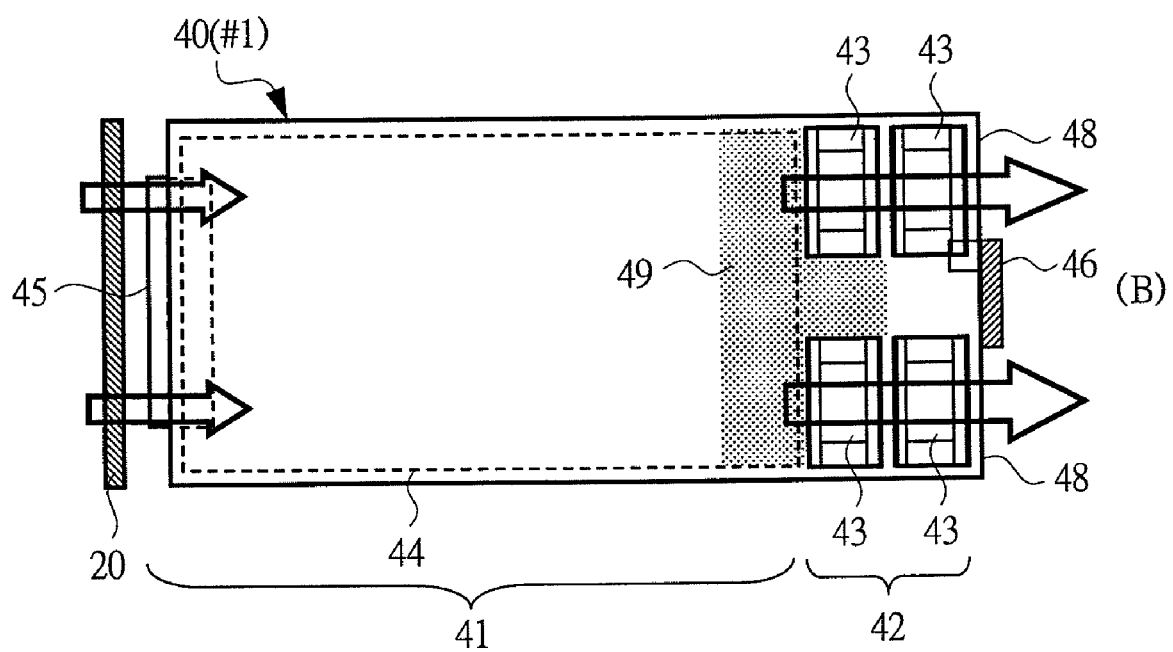
FIG. 14B is a diagram schematically showing a planar configuration of a power source module installed in the basic chassis and its periphery in the vertical direction (side surface)

In FIG. 14A and FIG. 14B, the power source module 40 has an integrated module configuration including the power source unit 41 and the fan unit 42, thereby reducing the size of the chassis. FIG. 14A shows a state in which one power source module 40 is installed between the outer wall 99 of the basic chassis 100 and the partition plate 95 in a horizontal plane. FIG. 14B schematically shows the state in a vertical plane (side surface).

The power source unit 41 comprises a substrate 44, and a connector 45 to be connected with the corresponding connector 204 of the backboard 20 is provided on the rear surface side of the power source module 40. A ventilation hole 49 corresponding to the position of the ventilation hole 96 of the partition plate 95 and the position of the fan 43 is formed in a part close to the rear surface (B) in the side surface facing the CTL module 10 of the power source module 40. In the present embodiment, the shape of the ventilation hole 49 is a convex shape which covers the area from the front fan 43 to the intermediate area between these fans. The shape of the corresponding ventilation hole 96 of the partition plate 95 is the same as that of the ventilation hole 49 or a shape covering the same.

The fan unit 42 has a redundant configuration to cool the inside of the basic chassis 100 by the operation of a plurality of fans (air blowers) 43. In the present embodiment, the fan unit 42 is similarly provided with two fans 43 each in the upper and lower areas corresponding to the upper and lower two CTL modules 10, and further, it is provided with two (duplex) fans 43 aligned in a back-and-forth direction (in tandem). In this configuration, total of four fans 43 are provided in one power source module 40. As the fan 43, for example, a fan such as an axial-flow fan is used.

By a blade rotational motion by a DC power supply, each fan 43 takes air from an air-intake port facing the front surface (A) and exhausts the air from the exhaust port facing the rear surface (B). By the operation of the fan 43, the cooling air which flows in from the rear surface side of the power source module 40 and is warmed through the power source unit 41 and the cooling air which is warmed through the CTL module 10 and flows into the vicinity of an air intake port through each ventilation hole (105, 96, and 49) are taken in from the air intake port, and then exhausted to the outside of the basic chassis 100 from the exhaust port in the back and the exhaust hole 48 of the power source module 40.

In the fan unit 42, since the duplex (plural) fans 43 are provided, even when one fan stops rotating, the cooling effect can be secured by the operation of the other fan. Further, even when the fan unit 42 in one of the left and right power source modules 40 stops rotating or even when the fan unit 42 is not installed in one of them, the cooling performance can be secured by the operation of the fan unit 42 in the other power source module 40. In that case, the cooling air in the CTL module 10 flows into the fan unit 42 of the power source module 40 operating normally.

<Example of Conventional Technology>

Next, for comparison purpose, a configuration (chassis, module and cooling structure) in the disk array system of the conventional technology (background technology) of the present embodiment will be briefly described below. In this conventional technology, in the basic chassis, modules such as the HDD group, the battery, and the like are installed in the front part, that is, on the front surface side from the backboard. Also, three types of modules such the CTL, power source, and fans and duplicated modules thereof, that is, a total of six modules are installed in the rear part, that is, on the rear surface side from the backboard. In the rear part, two CTL modules are adjacently disposed up and down in the upper area, and two power source modules are adjacently disposed side by side in the lower area. Two fan modules are disposed on both left and right sides of these modules. That is, in this configuration, power source module and fan module are separated. The HDD is, for example, a HDD of a fiber channel I/F. Further, in the expanded chassis, the modules of the HDD group are installed in the front part, that is, on the front surface side from the backboard. Two types of modules of the ENC and the power source and duplicated modules thereof, that is, a total of four modules are installed in the rear part, that is, on the rear surface side from the backboard. In the rear part, two ENC modules are adjacently disposed side by side in the upper area, and two power source modules are adjacently disposed side by side in the lower area.

<Design of Basic Chassis and Module>

The outline of the design for the basic structure of the basic chassis 100 and the layout of each module in the chassis in the present embodiment will be shown in the following (1) to (5). Basically, based on the mounting details of the modules, required specifications, and the like, the shape, size, layout, and the like of the module are designed, with taking into consideration the prevention of the interference between the connectors in the backboard 20 and the cooling structure in the chassis and the size reduction thereof (size standard and the like). With respect to the connector interference, the design is made so that the positions of the connectors to connect each module do not overlap one upon another and they are not located too close in the front and rear surfaces of the backboard 20.

(1) The layout of the HDD modules 30 is determined. Since the specification basically requires the mounting of the SAS-HDD 31, the position of the connector 32 on the side of the HDD 31 of the HDD module 30 and the position of the corresponding connector 203 on the side of the backboard 20 are determined. Specifically, the positions of the connectors (32 and 203) are located in the center zone of the backboard 20 as shown in FIG. 12 and FIG. 13. Further, in the front part 1, the battery module 50 and the like are disposed below the HDD module 30, and the configuration of the front part 1 is thus roughly determined. Also when the SATA-HDD 35 is installed, because of the interposition of the path control board 37, the chassis has approximately the same configuration as the case of SAS-HDD 31 in its entirety. By the change in the specification from the conventional configuration, the position of the connector 32 of the SAS-HDD 31 for the backboard 20 of the present configuration differs from the conventional position of the connector of the HDD of the fiber channel I/F for the backboard (moved from upper area to the center zone).

(2) The layout of the CTL module 10 is determined. The position of a connector 111 of the CTL module 10 and the position of the corresponding connector 201 on the backboard 20 are determined so as to prevent the connector interference in the backboard 20, in particular, to prevent the overlap with the position of the connector 32 of the HDD module 30 of the item (1). Specifically, the positions of the connectors (111 and 201) are located at the positions near the upper and lower sides of the backboard 20 as shown in FIG. 12 and FIG. 13. In the conventional configuration, the two power source modules are disposed below the two CTL modules (#1 and #2), and the connector of one CTL module (#2) is disposed near the center of the backboard. In the present configuration, in the rear part 2, the conventional two power source modules are moved to the left and right side areas (power source module 40), and two CTL modules (10) only are adjacently disposed up and down in the area between the power source modules. By this means, the position of the connector of one (lower side) CTL module (#2) is moved further downward than the conventional position.

(3) The layout of the power source module 40 is determined. According to the item (2), though the power source modules 40 are disposed in the left and right side areas (B2) of the chassis, since the fan modules exist in these areas in the conventional configuration, the power source modules 40 are integrated with the fan modules. More specifically, this power source module 40 is a combination type containing the power source unit 41 and the fan unit 42. Further, the positions of the connector 45 of the rear surface of the power source module 40 and the corresponding connector 204 on the backboard 20 are determined so as to prevent the connector interference. Specifically, the positions of the connectors (45 and 204) with a longitudinal rectangular shape are located near the left and right sides of the backboard 20 as shown in FIG. 12. The connectors of the power source module of the conventional configuration are disposed near the lower side of the backboard. In the present configuration, however, these connectors are unified with connectors of the left and right fan modules and are moved to the positions near the left and right sides of the backboard 20. In this manner, the configuration of the rear part 2 is roughly determined.

(4) Next, the structure of the flow path (and the flow amount and the like) of the cooling air from the front surface (A) of the front part 1 to the rear surface (B) of the rear part 2 of the basic chassis 100 through the backboard 20 is considered and designed. The layout and size distribution of the module mounting area in the chassis, the layout of the partition plate and ventilation hole, the layout, area, and the like of the opening hole 220 of the backboard 20 are considered and designed. Further, the design of the flow path is considered so as to equalize the flow amount to each duplex component (CTL modules 10 and the like).

(5) Further, in particular, the details of the cooling structure of a combination of the CTL module 10 and the power source module 40 in the rear part 2 are determined. Specifically, the cooling air flow path is determined by the layout of the fan unit 42, the ventilation hole 96 of the partition plate 95, and no provision of the ventilation hole in the front surface (106) of the CTL module 10. Further, as the cooling structure in the CTL module 10, the position of the cooling object components (IC and the like) and the shape and position of the corresponding block 150 are devised.

<Cooling Structure>

In FIG. 10 and FIG. 11, the basic cooling structure in the basic chassis 100 is as follows. By the operation of the fan 43 of the fan unit 42, the outside air is taken in the front part 1 from the front surface (A), passes between the HDDs 31 and like as a cooling air, and then flows into the rear part 2 through the opening hole 220 of the backboard 20. In the rear part 2, the cooling air is divided and flows into the CTL module 10 and the power source module 40, respectively. By the partition plate 95 between the power source module 40 and the CTL module 10, the cooling air is separated and rectified. Further, by the partition plate between the two CTL modules 10, the cooling air is separated into the upper and lower areas.

In the rear part 2, the cooling air passes and cools each component in the CTL module 10 and the power source unit 41 in the power source module 40, respectively. Such cooling air is drawn by the fans 43 in the power source module 40 and is exhausted outside from the exhaust hole 48 of the power source module 40 on the side of the rear surface (B). In the CTL module 10, the cooling object components are efficiently cooled by the area 114 with the duct structure formed by the block 150. From the inside of the CTL module 10 to the inside of the power source module 40, the cooling air flows into the fan 43 through the ventilation hole 96 (and the corresponding ventilation holes 105 and 49) and the like of the partition plate 95. The position of the ventilation hole 96 in the partition plate 95 between the CTL module 10 and the power source module 40 is not in the entire surface of the partition plate 95 but at a part close to the fan unit 42 on the rear side of the chassis. By this means, the cooling air is rectified and the cooling efficiency can be enhanced. The front surface 106 of the CTL module 10 is closed.

The cooling air flow path in the configuration in the basic chassis 100 and the flow amount and flow distribution therein will be described with reference to FIG. 10 and FIG. 11. In FIG. 10, the distribution of the flow amount in this plane, for example, is as follows. It is assumed that a flow amount 10 flows into the front part 1 (the HDD module 30 group) from the front surface (A). In the rear part 2, the module layout, the area of the opening hole 220 and the like are designed so that the cooling air is equally distributed to the CTL module 10 and the power source module 40. More specifically, when considering one area of the upper and lower sides in the chassis, a flow amount of 5 of the flow amount of 10 from the front part 1 flows into one CTL module 10, and a remaining flow amount of 5 flows into the left and right power source modules 40 in total (individually flow amount of 2.5). In the CTL module 10, a flow amount of 2.5 of the flow amount of 5 is separately supplied to each of the left and right power source modules 40 and drawn into the fan unit 42 (fans 43). In the fan unit 42 of each of the left and right power source modules 40, the flow amount of 2.5 from the power source unit 41 and the flow amount of 2.5 from the CTL module 10 are drawn, and a total of the flow amount of 5 is exhausted outside.

Further, the cooling air flown into one CTL module 10 of the rear part 2 from the opening hole 220 of the backboard 20 cools each component (shown by rectangle) such as an IC and a heat sink (112) formed thereon provided on a CTL substrate (120). The cooling air flows toward the rear surface (B), and after cooling each component, it passes through the ventilation holes 96 (and the corresponding ventilation holes 105 and 49) of the left and right partition plates 95 and is drawn by the fans 43 in each power source module 40 from inside of the CTL module 10.

Further, in FIG. 11, for example, the distribution of the flow amount in this plane is as follows. It is assumed that the flow amount of 10 flows into the front part 1 from the front surface (A). The module layout, the area of the opening hole 220 and the like are designed so that the flow amount is distributed at the rate of 8:2 in the HDD module 30 and the battery module 50. In this design of the configuration, the HDD module 30 is more efficiently cooled than the battery module 50. The flow amount is equally (5:5) distributed to the two (duplex) CTL modules 10 of the rear part 2. From the HDD module 30 of the front part 1, a flow amount of 5 of the flow amount of 8 flows into the upper CTL module 10 (CTL#1) and a remaining flow amount of 3 flows into the lower CTL module 10 (CTL#2). From the battery module 50 of the front part 1, a flow amount of 2 flows into the lower CTL module 10 (CTL#2). The flow amount of 5 in each of the upper and lower CTL modules 10 is drawn by the fan unit 42 in the power source module 40 and is exhausted outside (broken line arrow mark).

<CTL Module>

Next, the cooling structure of the CTL module 10 will be described in detail with reference to FIG. 15 to FIG. 18 and the like.

Figure 15:
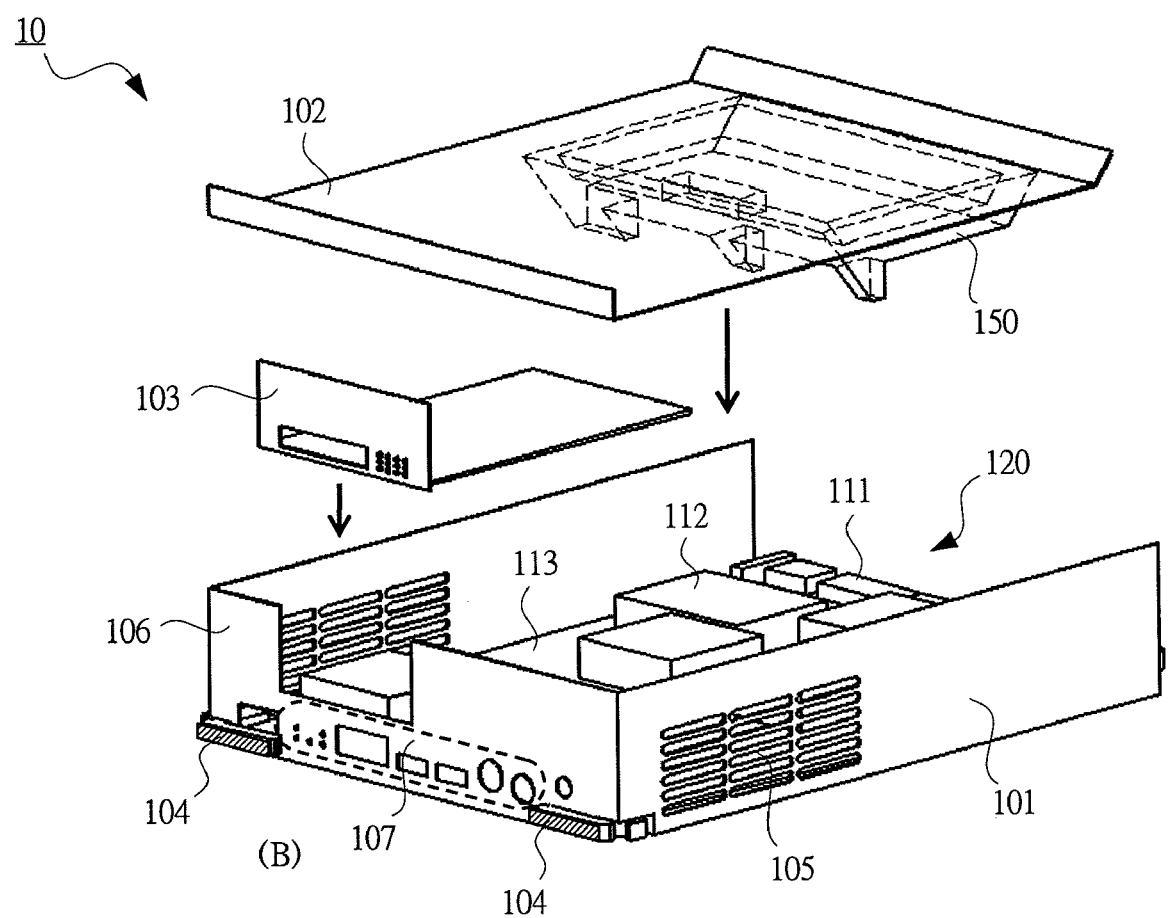
FIG. 15 is a perspective view showing a disassembled state of the structure of a CTL module installed in the basic chassis.

FIG. 15 shows a structure of the CTL module 10 in a disassembled state. After storing and connecting component parts such as a CTL substrate (control package) 120, a host I/F unit 103, and a block 150 serving as a filler in a main body 101 of the CTL module 10, a top cover 102 serving as the upper surface is attached by screws and the like.

The CTL substrate 120 is attached to the bottom surface of the main body 101. The main body 101 and the top cover 102 are mainly a package made from metal plate and they form the most part of the outer shape of the CTL module 10. The areas for the ventilation holes 105 corresponding to the layout and shape of the ventilation holes 96 provided in the partition plate 95 at the boundary with the power source modules 40 are provided on both side surfaces of the main body 101. In the present embodiment, the shape of the ventilation hole 105 is a horizontal rectangular by a plurality of slits. The front surface 106 (the rear surface (B) side of the basic chassis 100) of the may body 101 has a notched area corresponding to the attachment of the host I/F unit 103. The host I/F unit 103 includes a substrate, a front panel, terminals and others. The connector 111 and the like of the CTL substrate 120 are exposed on the rear surface side of the main body 101.

Further, various terminals, display elements, and the like are mounted in a part of the area of the front surface 106 of the CTL module 10, particularly in an area 107 near the center of the lower side thereof. In this area 107, for example, a display LED, LAN terminal, backend system terminal, remote adaptor terminal, UPS terminal and the like are mounted.

Further, on the left and right sides of this area 107, that is, at the bottom left and right corners of the front surface 106, the operating levers 104 are provided. The operating lever 104 is, for example, a mechanism of fixing and releasing the CTL module 10 to and from the chassis by the operation of rotating a lever main body on a fixing axis (support point) at the corner of the CTL module 10, that is, the operation of putting up and down the lever main body on the front surface 106 of the CTL module 10. When fixing the module, the lever main body is put down so as to be in parallel with the front surface 106. By this means, its one end (side surface side) is hooked on the structure (receiving portion) on the side of the partition plate 95 of the chassis, and the other side (inner side) is latched on the structure (receiving portion) on the side of the front surface 106 of the CTL module 10.

The block 150 is, for example, a structure made of a foamed material. The block 150 having a layout and shape corresponding to the cooling objects (including the heat sink 112) on the CTL substrate 120 is attached onto the lower surface (area 114) of the top cover 102. The block 150 forms a part of the cooling air flow path (in other words, the duct) in the CTL module 10. Incidentally, in the heat sink 112 illustrated here, the details of fins and the like are omitted.

<CTL Substrate>

Figure 16:
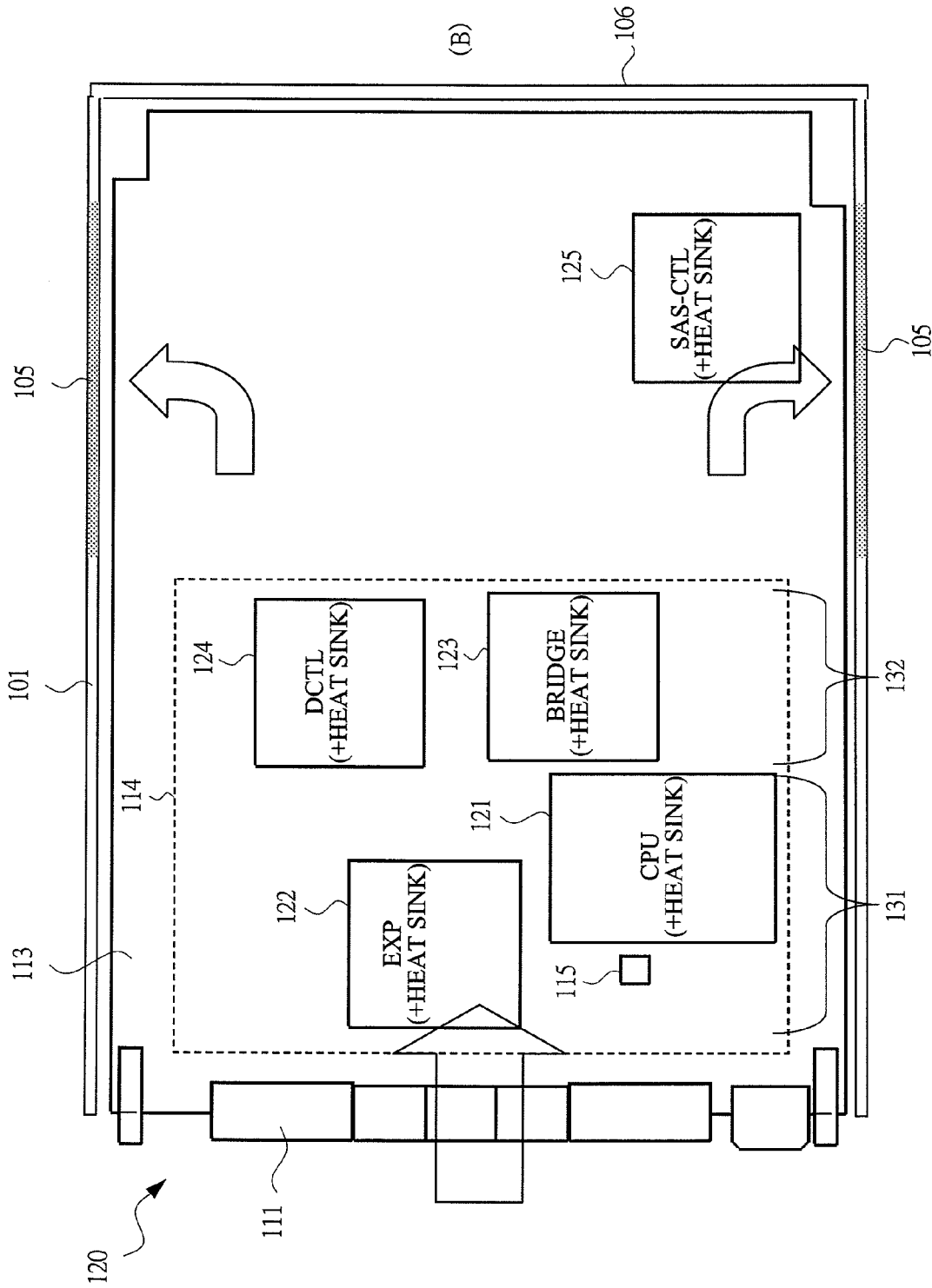
FIG. 16 is a diagram showing a CTL substrate stored in the CTL module, components to be installed thereon, and the peripheral configuration thereof.

FIG. 16 shows a component layout in the CTL substrate 120, the main body 101 of its periphery, and the ventilation hole 105. The CTL substrate 120 has a roughly flat-plate shape by a substrate 113. A connector (BB connection connector) 111 for the connection to the backboard 20 is provided on one side of the CTL substrate 120. On the substrate 113 of the CTL substrate 120, for example, main parts such as ICs are installed in accordance with the layout as illustrated. These parts generate a relatively large amount of heat by the operation thereof and are the components in which particular consideration must be given to the cooling performance. These cooling objects include, for example, a CPU 121, a SAS expander (EXP) 122, a bridge 123, a DCTL 124, a SAS interface controller (SAS-CTL) 125 (consideration is given by including the heat sink 112 installed on the IC and the like). The CPU 121 corresponds to the CPU 11. The bridge 123 corresponds to the bridge 12. The DCTL 124 corresponds to the DCTL 15. The EXP 122 and SAS-CTL 125 correspond to the SW 18. In the present embodiment, in about half the area on the side close to the connector 111 of the substrate 113, the block 150 is disposed in the area 114 above the cooling object components including the CPU 121 to DCTL 124 (including the heat sink).

Further, in the present embodiment, a temperature sensor 115 is provided in front of the CPU 121 on the side close to the connector 111 on the substrate 113. Based on the temperature (temperature in the chassis) detected by the temperature sensor 115, a fan control described later is performed. Also in the ENC module 70, similarly to the CTL module 10, the temperature sensor 115 is provided. In the CTL 110 and ENC 170, the fan control is performed by the environment management unit (K) 22.

The flow (arrow mark) of the cooling air to the cooling object components on the CTL substrate 120 will be described. That is, the cooling air which flows into the CTL module 10 first cools the periphery of the cooling object (#1) 131 including the CPU 121 and the EXP 122 provided in the vicinity of the connector 111 on the CTL substrate 120. Subsequently, the cooling air flows toward the rear surface (B) and cools the periphery of the cooling object (#2) 132 including the bridge 123 and the DCTL 124 located at the latter stage of the cooling object 131 at the former stage. Then, the cooling air flows further backward and cools other components such as the SAS-CTL 125 near the rear surface (B). After each component in the CTL module 10 is cooled, since the front surface 106 of the CTL module 10 is closed, the cooling air passes through the ventilation hole 105 of the main body 101 of the rear part (close to the rear surface (B)) and is drawn into the power source module 40 from the CTL module 10.

For the improvement in efficiency of ventilation/exhaust by the fan unit 42, the exhaust hole and the like are not provided in the front surface 106 of the CTL module 10 (closed as the flow path). Accordingly, the air once exhausted outside from the fans 43 does not flow (circulate) into the CTL module 10.

<Block>

Figure 17:
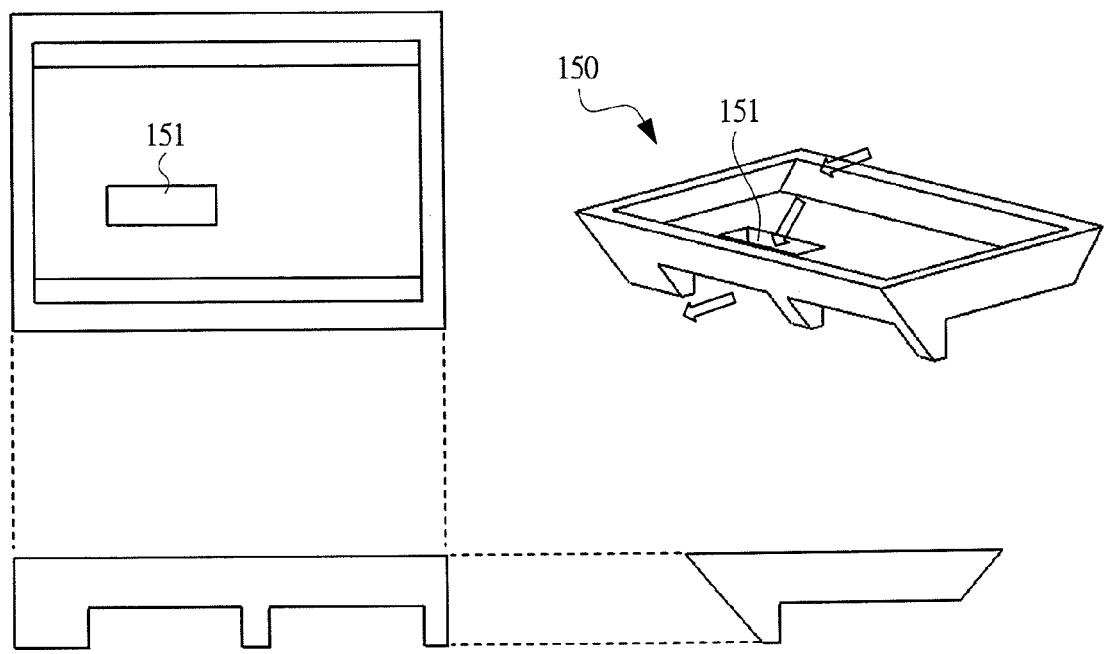
FIG. 17 is a diagram showing the structure of a block to be installed in the CTL module with a three-side view and an isometric view.

In FIG. 17, the structure of the block 150 is shown by a three-side view and an isometric view. The block 150 forms the cooling air flow path (duct structure) when disposed in the CTL module 10. The block 150 has a shape based on a main body with a roughly rectangular section provided with concavity and convexity. In the block 150, concavity and convexity are formed to the main body thereof so that a space for the flow path corresponding to the layout and shape of the cooling object components (131 and 132) is formed. Further, in the block 150, the side of the main body thereof adjacent to the upper surface (top cover 102) of the CTL module 10 serves as a space for the ventilation, and a hole (conduit in the block) 151 passing from that space to the cooling object component 132 in the CTL module 10 is formed. Because of the block 150, the cooling air flow path (duct) can be configured to have a shape capable of efficiently cooling the cooling object components (131 and 132) and having rectifying effect.

Figure 18:
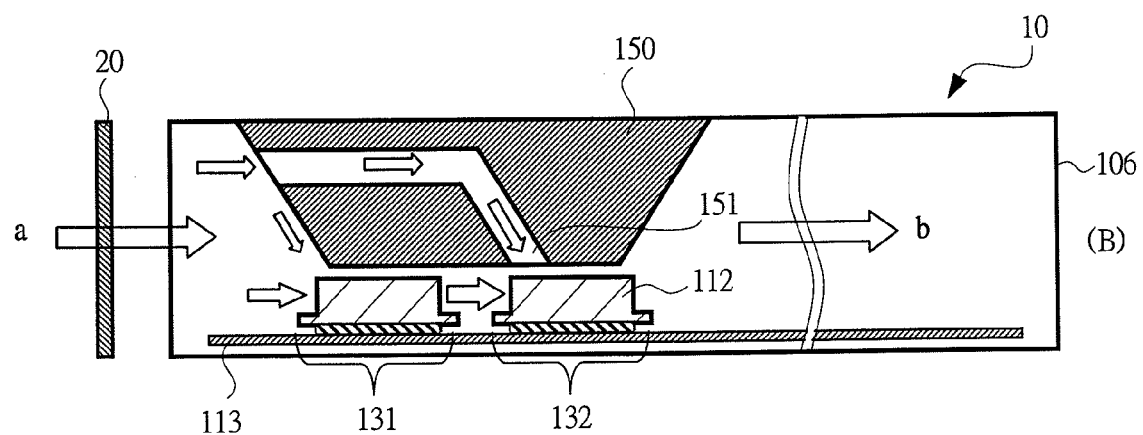
FIG. 18 is a diagram showing a cooling air flow path (duct structure) by means of the block and the like in the CTL module.

FIG. 18 schematically shows a cooling air flow path in the periphery of the block 150 in the CTL module 10 by a section in the direction of the side surface of the chassis. In the block 150, slopes (inclination) by a trapezoid are formed in the portions corresponding to the side where the cooling air flows in and the side where the cooling air flow out. Because of the slopes, the flow of the cooling air is smoothed, and the cooling air can be efficiently applied to the cooling object component 131. The slope is not limited to that having a flat surface, and the one having a curved surface is also available. The one air (intake air) taken in from the rear surface side of the CTL module 10 shown by a is guided by the slope of the block 150 and is applied to the cooling object component 131 (for example, EXP 122) on the former stage, and the other air passes through the flow path by the hole 151 and the like of the block 150 and is directly applied to the cooling object component 132 (for example, DCTL 124) on the latter stage. The cooling air which flows out from the slope on the rear side of the block 150 is supplied (exhausted) backward (front surface 106 side) in the CTL module 10 as shown by b and is drawn by the fan unit 42 of the power source module 40.

Incidentally, the inflow of the cooling air into the inner space and the hole 151 of the block 150 is, for example, from the lower surface of the top cover 102. Further, for example, the structure in which the air flows from a notched part formed in the slope of the block 150 into the inner space of the block 150 and then reaches the hole 151 is also possible. The block 150 can have any shape as long as the cooling air can be directly applied to the cooling object component 132 of the latter stage, and various types can be used.

Since the cooling air flowing into the CTL module 10 is immediately applied to the cooling object components (#1) 131, for example, the EXP 122 and the CPU 121 close to the connector 111 side, the cooling performance of the components is relatively high. Meanwhile, since the air once warmed through the EXP 122 and the like is applied to the cooling object components (#2) 132, for example, the bridge 123, the DCTL 124, and the like adjacent to the back thereof, the cooling performance is relatively deteriorated. To cope with the situation, in the present embodiment, by branching the cooling air flow path by means of the structure of the block 150, the cooling air is directly applied also to the cooling object component 132 of the latter stage. In this manner, the cooling performance of the cooling object component can be enhanced.

<Fan Control>

Next, a fan control in the disk array system 5 will be described. The operation of the fan unit 42 in the power source module 40 is controlled (fan control) mainly by the environment management unit (K) 22, for example, the CTL 110 and the ENC 170, thereby adequately controlling the temperature state of the system. The processing for the fan control is realized by a program processing by a processor corresponding to the environment management unit (K) 22 or a hardware logical circuit. In the fan control, the environment management unit (K) 22 detects the temperature (temperature in chassis) by the temperature sensor 115 and performs a control (temperature control) to automatically switch the operation mode of the fan unit 42 (fans 43) based on the detected temperature. As the operation mode, various types of modes different in rotation speed such as the fastest mode (abnormal time and the like), the high speed mode (intensive cooling time), the intermediate speed mode (normal time), and the low speed mode (waiting time) are provided.

In this temperature control, for example, when the sensor detection temperature is within the normal range, the control is set to the intermediate speed mode, and when it reaches the predetermined temperature or more, the mode is switched to the high speed mode. By setting the high driving voltage, the number of rotations (rotation speed) of the fan is increased, and the flow amount of the cooling air is increased. In this manner, regardless of the presence of failures, the cooling performance can be secured. Incidentally, the cooling performance is converted as [sensor detection temperature (temperature in chassis)]=[outside temperature (environmental temperature)]+[0 to 7° C.]. For details, the change in the number of fan rotations by the driving voltage is made by the switchover of a duty ratio of the input pulse to the fan 43 (pulse frequency to the fan specification).

Further, as the conventional technology, the control in which the fan rotation speed is switched when the troubles and connections of the CTL, power sources (PS), fans and the like are detected in association with the maintenance and replacement services has been known (trouble detection control and abnormal time control). In the disk array system 5, the trouble detection control and the temperature control described above are combined together when performing the fan control.

In the trouble detection control, when the trouble of a part of the fan unit 42 or the fan 43, that is, a trouble, an operation stop, a disconnected state, and the like are monitored and detected, by the adjustment of the driving voltage for the fan unit 42, the operation of the fan unit 42 (fans 43) normally connected at that time is switched to the operation mode so as to increase the rotation speed. For example, the operation mode is switched from the intermediate speed mode to the high speed mode. By this means, the flow amount of the cooling air is increased, thereby compensating for the decrease of the cooling performance due to the trouble. Even when one of the left and right fan units 42 (a part of the fan 43) are out of service, the cooling performance of the CTL 110 and the like can be secured. When restored to the normal state, the operation mode is returned to the intermediate speed mode or others.

The control conditions of this fan control are as follows. That is, the intermediate speed mode (or the low speed mode) is used when the temperature in chassis is less than 39° C., and when it is 39 to 47° C., the high speed mode is used, and when it is 47° C. or more, the fastest mode is used. Further, at the time of the system abnormal state, the operation mode is set to the fastest speed mode. The number of rotations of the fan at each operation mode is, for example, 3240 to 4112 rpm for the low speed mode, 5400 to 6890 rpm for the intermediate speed mode, 8100 to 10300 rpm for the high speed mode, and 10800 rpm or more for the fastest speed mode. Further, the system abnormal state includes, for example, a state where one CTL is removed (disconnected state of the one CTL module 10), a state where one PS is removed (disconnected state of the one power source module 40), a state where one PS is in an abnormal state (abnormal state of the one power source module 40), a state where the number of fan rotations is insufficient (abnormal state of the fan 43), and the like. Also, in the system abnormal state, an alarm (warning) is outputted together with the fan control. For example, when the state where the number of fan rotations is sufficient is detected successively a predetermined number of times (more than the predetermined period), an alarm by means of an LED lighting, a message, and sound is outputted. Incidentally, even when the system is in an abnormal state, when one of the duplex modules normally operates, it functions as the disk array system.

Figure 19:
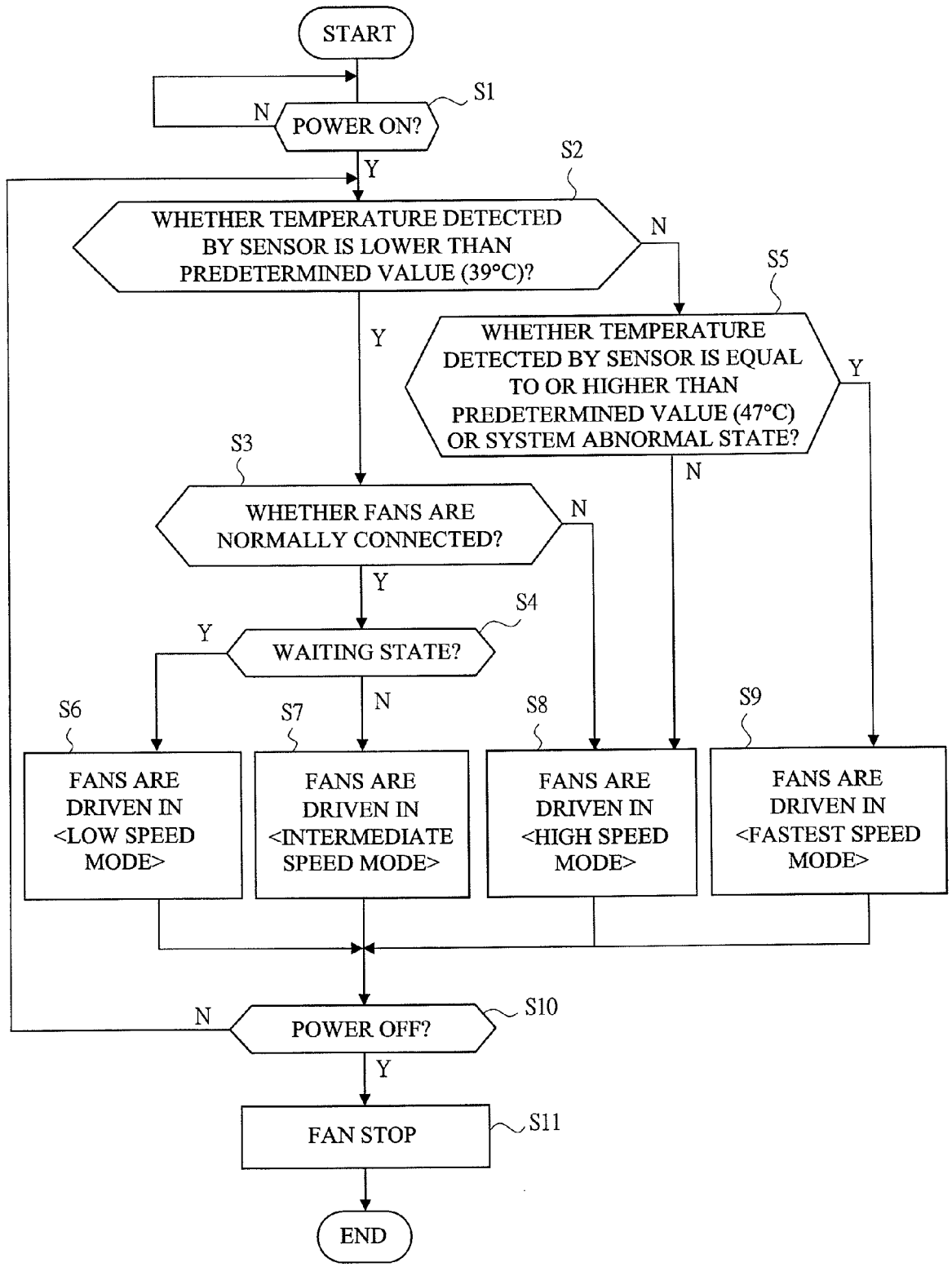
FIG. 19 is a diagram showing an example of the processing flow of a fan control in the disk array system of the present embodiment.

In FIG. 19, the processing flow of the fan control in the basic chassis 100 and the CTL 110 is as follows (S denotes the processing step). At S1, when the CTL 110 is turned on (S1-Y), the temperature detected by the temperature sensor 115 (temperature in chassis and the CTL intake air temperature) is checked at S2. When the temperature is less than the predetermined value, that is, when the temperature in chassis is less than 39° C. in the present embodiment (environment temperature is 32° C.) (S2-Y), in other words, when the environment temperature is in the normal range, a fan connection state to the chassis is determined at S3. More specifically, it is determined whether the left and right two fan units 42 (each four fans 43 for the left and right sides) of the chassis are normally connected to the CTL 110. Preferably, the state of a plurality of fans 43 is determined individually. When the left and right two fan units 42 are both connected, that is, when all the fans 43 are in a normal connected state (S3-Y), unless the system is in a waiting state (no data input/output state) (S4-N), each fan unit 42 (each fan 43) is driven in the intermediate speed mode by the predetermined driving voltage at S7. Further, when the system is in a waiting state (S4-Y), the fan unit 42 (each fan 43) is driven in the low speed mode at S6. When the power of the CTL 110 is turned off (S10-Y), the operation of each fan unit 42 is stopped, and when it is not turned off (S10-N), the processing returns to S2.

Further, when the left and right fan units 42 are in a state of being not normally connected (S3-N) at S3, that is, when only one fan unit 42 (or a part of the fans 43) is operating, the connected fan unit 42 (or the fans 43) is driven in the high speed mode at S8.

Further, when the temperature (temperature in chassis) detected by the temperature sensor 115 is the predetermined value (39° C.) or more at S2 (S2-N), the mode is changed to the high speed mode or the like. In this case, since the environment temperature is higher than the normal range, this is considered as a highly heated state due to a high load of the CTL 110, a troubled state or a system abnormal state due to some causes. As for the troubled state, the failure of one fan unit 42 (or a part of the fans 43) and the disconnected state and the like are considered. At this time, the temperature state and the state of the fan unit 42 (fans 43) and the like are determined at S5. More specifically, it is determined whether the temperature in chassis is equal to or higher than the predetermined value, in this embodiment, it is 47° C. or higher or whether the system is in an abnormal state. When the temperature is less than the predetermined value (47° C.) or when the system is not in the abnormal state (S5-N), the fan unit 42 (fans 43) is driven in the high speed mode at S8, and when the temperature is equal to or more than the predetermined value (47° C.) or when the system is in an abnormal state (S5-Y), the fan unit 42 (fans 43) normally connected is driven in the fastest speed mode at S9.

<Cooling State Example>

Figure 20:
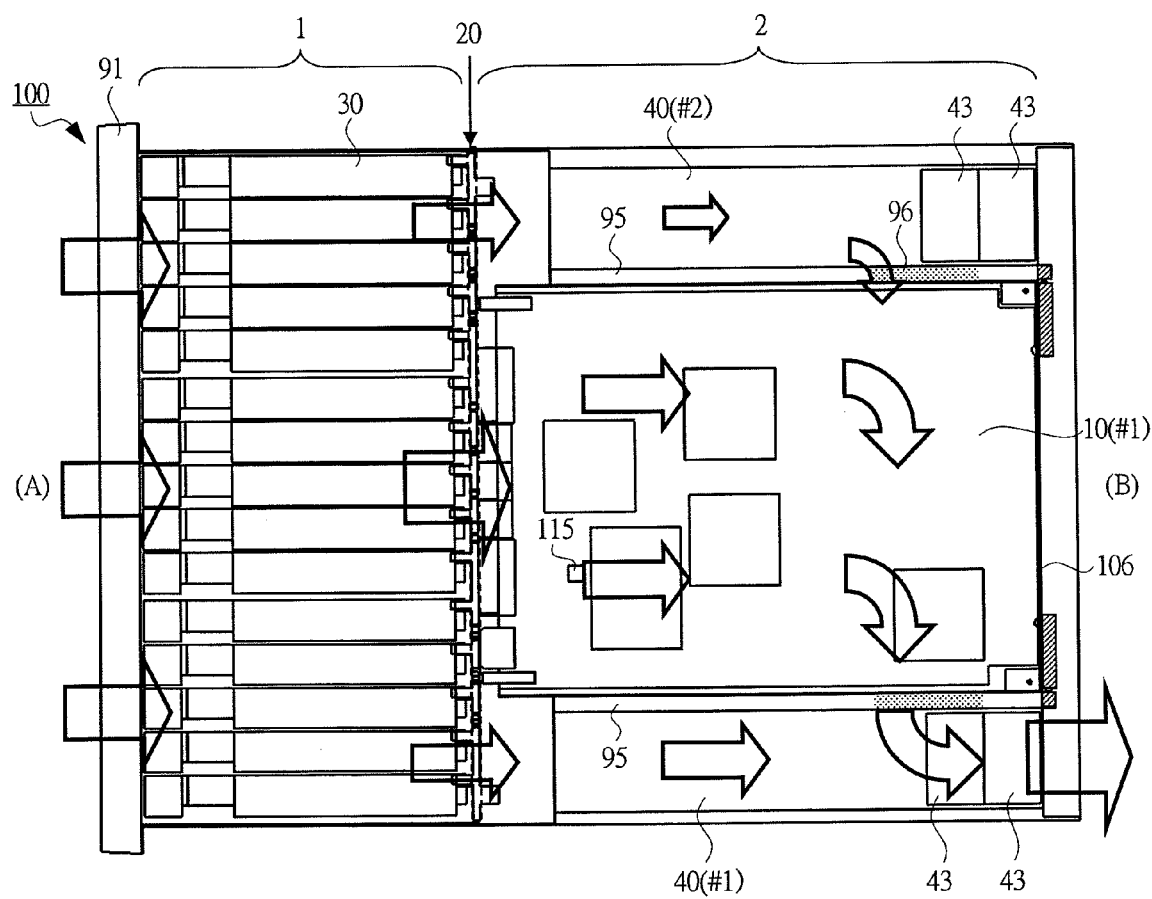
FIG. 20 is a diagram schematically showing a representative flow of the cooling air at the time when only one power source module (and fan unit) is operated in a planar structure of the basic chassis in a horizontal direction.

FIG. 20 shows the flow of the cooling air at the time when only one of the left and right power source modules 40 (fan unit 42) of the basic chassis 100 is operated. For example, it corresponds to the state where one PS is in an abnormal state or the state where one PC is removed, and the state where the right power supply module (#2) relative to the rear surface (B) is not connected or troubled is shown here. By the fan control described above, the operation of the fan unit 42 of the left power source module 40 (#1) normally connected and operated is switched to the high speed mode or the fastest speed mode. By this means, the cooling air (each cooling air of the CTL modules (#1 and #2) 10 and each cooling air of the power source units (#1 and #2) 41) in the rear part 2 are all drawn and exhausted by the fan unit 42 of the normal one (#1). Accordingly, the cooling performance particularly in the CTL module 10 is also secured.

In the fan unit 42, when one of the fans 43 aligned in a back-and-forth direction is in trouble, the cooling performance is secured by the operation of the other fan. Further, when one of the upper and lower fans 43 is out of order, the cooling performance is secured by the operation of the other fan.

<Effect of the Embodiment>

As described above, according to the present embodiment, the following effect can be obtained. In the present embodiment, the new structures for the chassis and modules as well as the cooling structure are realized in consideration of the high density mounting and the cooling performance. Particularly, in the basic chassis 100, the size reduction is realized by the reduction of the number of modules (CTL modules 10 installed up and down and the power source modules 40 disposed left and right). Further, with respect to the cooling performance, because of the exhaust in the left and right power source modules 40 (fan unit 42), the structure of the backboard 20 (connector position and opening hole 220), the ventilation hole 96 of the partition plate 95, the duct structure by means of the block 150 in the CTL module 10, and the fan control using the temperature sensor 115, the efficient cooling of each unit of the CTL board 120 can be realized in both the normal state and the abnormal state. Since the cooling performance can be secured, the improvement of the processing performance and the reliability of the disk array system can be achieved.

Incidentally, although the structure of the basic chassis having the HDD 31 has been described in FIG. 4 to FIG. 20, the present invention is not limited to this. For example, it can be applied to the basic chassis having no HDD 31. Further, although the structure of the basic chassis 100 has been described in FIG. 4 to FIG. 20, the present invention can be applied not only to the basic chassis 100 but also to the expanded chassis 200. In this case, in FIG. 4 to FIG. 20, the enclosure (ENC) is mounted in the position where the controller (CTL) is installed.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be used for equipment such as the disk array system.

What is claimed is:

1. A disk array system provided with a group of storage devices and a controller for controlling these devices, comprising:

a basic chassis having openings in front and rear surfaces thereof and a backboard fixed at a midpoint in its interior; and a plurality of storage device modules, at least one controller module and two duplicated power source modules as modules installed by insertion/removal and fixation to a front part and a rear part of the backboard, wherein the controller module contains a controller substrate and a flow path is closed at a rear side surface of the chassis, and the power source module contains a power source unit and a fan unit disposed close to the rear side surface of the chassis at the back of the power source module and an exhaust hole area is provided in a rear side surface of the chassis, the plurality of storage device modules are installed in the front part, the two power source modules are installed in areas close to left and right side surfaces of the chassis in the rear part, and the controller module is disposed in areas between the two power source modules, a ventilation structure for cooling air between the controller module and the two power source modules is provided at positions near the fan units at the back of the power source modules, and by operation of the fan unit, cooling air taken from the chassis front surface in the front part passes through the storage device modules and is then supplied to the rear part through an opening hole of the backboard, and in the rear part, one first cooling air flows into the controller module and the other second cooling air flows into the two power source modules, and the first cooling air passes through an area of a plurality of cooling object components on the controller substrate in the controller module and flows into a vicinity of the fan units in the power source modules through the ventilation structure and is then drawn by the fan units, and the second cooling air passes through the power source units in the power source modules and is drawn by the fan units at the back thereof and is then exhausted outside from an area of the exhaust hole in the chassis rear side surface of the power source modules by the fan units.

2. The disk array system according to claim 1, wherein the basic chassis has a first partition plate between the power source module and the controller module, and as the ventilation structure, an area of a ventilation hole is provided in a part of the first partition plate and its corresponding side surfaces of the power source module and the controller module so as to correspond to the position of the fan unit at the back of the power source module.

3. The disk array system according to claim 1, wherein, as the storage device modules, a SAS-HDD module having a SAS HDD and a connector at a lower side of a rear surface thereof and a SATA-HDD module having a SATA interface HDD and a connector at a lower side of a rear surface thereof can be installed, and when the SATA-HDD module is to be installed, a path control board for an interface conversion of SAS and SATA is interposed and connected between the module and the backboard.

4. The disk array system according to claim 1, wherein the plurality of storage device modules are installed in an upper area of the front part, and two duplicated battery modules and a panel module having an operation panel are installed in a lower area thereof, and a position and area of the opening hole of the backboard are designed so that the cooling air of the front part flows into the upper area of the plurality of storage device modules more than the lower area of the battery modules.

5. The disk array system according to claim 1, wherein the fan unit has duplex fans disposed front and back and up and down in each of the two power source modules.

6. The disk array system according to claim 1, wherein the controller has a CPU, a bridge, a data controller, a host interface unit, a disk interface unit, a SAS expander, and a cache memory, and the controller substrate includes the CPU, the bridge, the data controller, the SAS expander, and heat sinks installed thereon as the plurality of cooling object components.

7. The disk array system according to claim 1, further comprising: an expanded chassis electrically connected to the basic chassis and having openings in front and rear surfaces thereof and a backboard fixed at a midpoint in its interior; and a plurality of storage device modules, two duplicated enclosure modules and two duplicated power source modules as modules installed by insertion/removal and fixation to a front part and a rear part of the backboard of the expanded chassis, wherein the enclosure module contains an enclosure substrate having a SAS expander, and the power source module of the expanded chassis contains a power source unit and a fan unit having a plurality of fans, and the plurality of storage device modules are installed in the front part of the expanded chassis, and the two enclosure modules are installed side by side in an upper area and the two power source modules are installed side by side in a lower area in the rear part.

8. A disk array system provided with a group of storage devices and a controller for controlling these devices, comprising: a basic chassis having openings in front and rear surfaces thereof and a backboard fixed at a midpoint in its interior; and a plurality of storage device modules, at least one controller module and two duplicated power source modules as modules installed by insertion/removal and fixation to a front part and a rear part of the backboard,
wherein the controller module contains a controller substrate and a flow path is closed at a rear side surface of the chassis, and the power source module contains a power source unit and a fan unit disposed close to the rear side surface of the chassis at the back of the power source module and an exhaust hole area is provided in a rear side surface of the chassis, the plurality of storage device modules are installed in the front part, the two power source modules are installed in areas close to left and right side surfaces of the chassis in the rear part, and the controller module is disposed in areas between the two power source modules, a ventilation structure for cooling air between the controller module and the two power source modules is provided at positions near the fan units at the back of the power source modules, by operation of the fan unit, cooling air taken from the chassis front surface in the front part passes through the storage device modules and is then supplied to the rear part through an opening hole of the backboard, and in the rear part, one first cooling air flows into the controller module and the other second cooling air flows into the two power source modules, and the first cooling air passes through an area of a plurality of cooling object components on the controller substrate in the controller module and flows into a vicinity of the fan units in the power source modules through the ventilation structure and is then drawn by the fan units, and the second cooling air passes through the power source units in the power source modules and is drawn by the fan units at the back thereof and is then exhausted outside from an area of the exhaust hole in the chassis rear side surface of the power source modules by the fan units, the controller has an environment management unit, a temperature sensor is provided in the controller module, and the environment management unit performs a switching control so as to increase a rotation speed of the fan of the fan unit when a temperature detected by the temperature sensor becomes equal to or higher than a predetermined temperature.

9. The disk array system according to claim 8, wherein the environment management unit monitors and detects a state of the power source module and the fan unit, and when it is judged as a disconnected state or an abnormal state, it performs a switching control so as to increase the rotation speed of the fans of the fan unit in a normally connected state.

10. The disk array system according to claim 8, further comprising: an expanded chassis electrically connected to the basic chassis and having openings in front and rear surfaces thereof and a backboard fixed at a midpoint in its interior; and a plurality of storage device modules, two duplicated enclosure modules and two duplicated power source modules as modules installed by insertion/removal and fixation to a front part and a rear part of the backboard of the expanded chassis, wherein the enclosure module contains an enclosure substrate having a SAS expander, and the power source module of the expanded chassis contains a power source unit and a fan unit having a plurality of fans, the plurality of storage device modules are installed in the front part of the expanded chassis, and the two enclosure modules are installed side by side in an upper area and the two power source modules are installed side by side in a lower area in the rear part, the enclosure has an environment management unit, a temperature sensor is provided in the enclosure module, and the environment management unit of the enclosure module performs a switching control so as to increase a rotation speed of the fan of the fan unit in the power source module of the expanded chassis when a temperature detected by the temperature sensor becomes equal to or higher than a predetermined temperature.

* * * * *